US009240805B2

(12) United States Patent
Doi et al.

(10) Patent No.: US 9,240,805 B2
(45) Date of Patent: Jan. 19, 2016

(54) PARITY CHECK MATRIX CREATION METHOD, ENCODING APPARATUS, AND RECORDING/REPRODUCTION APPARATUS

(71) Applicant: KABUSHIKI KAISHA TOSHIBA, Minato-ku (JP)

(72) Inventors: Kazuaki Doi, Kawasaki (JP); Akihito Ogawa, Fujisawa (JP); Hironori Uchikawa, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/487,679

(22) Filed: Sep. 16, 2014

(65) Prior Publication Data

US 2015/0006989 A1 Jan. 1, 2015

Related U.S. Application Data

(63) Continuation of application No. PCT/JP2012/056933, filed on Mar. 16, 2012.

(51) Int. Cl.
*H03M 13/15* (2006.01)
*H03M 13/11* (2006.01)
(Continued)

(52) U.S. Cl.
CPC ........... *H03M 13/1151* (2013.01); *G06F 11/10* (2013.01); *H03M 13/036* (2013.01); *H03M 13/116* (2013.01); *H03M 13/2906* (2013.01); *H03M 13/152* (2013.01)

(58) Field of Classification Search
CPC .................................................... H03M 13/151
USPC ......................... 714/781, 752, 776, 790, 757
See application file for complete search history.

(56) References Cited

U.S. PATENT DOCUMENTS

2010/0180176 A1* 7/2010 Yosoku et al. ................ 714/752
2010/0229066 A1 9/2010 Matsumoto et al.

FOREIGN PATENT DOCUMENTS

WO 2007/080827 A1 7/2007

OTHER PUBLICATIONS

International Search Report issued on May 1, 2012 for PCT/JP2012/056933 filed on Mar. 16, 2012 with English Translation.
(Continued)

*Primary Examiner* — Fritz Alphonse
(74) *Attorney, Agent, or Firm* — Oblon, McClelland, Maier & Neustadt, L.L.P.

(57) ABSTRACT

According to an embodiment, in a parity check matrix creation method, all N column vectors in the mask matrix are different. A submatrix having M rows×L columns obtained by arbitrarily extracting L continuous columns from the mask matrix includes $B_1$ first correction rows and $B_i$ ith correction rows. The $B_1$ first correction rows have at least one "1" in total in each of $A_1$ first correction columns. Each of the $B_i$ ith correction rows has at least one "1" in total in $A_{i-1}$ (i−1)th correction columns and has "1" in one of $A_i$ ith correction columns included in a column set excluding the first correction columns to (i−1)th correction columns. The $B_i$ ith correction rows include at least one "1" in total in each of the $A_i$ ith correction columns. A sum from $A_1$ to $A_I$ equals L.

10 Claims, 57 Drawing Sheets

(51) Int. Cl.
  *H03M 13/03* (2006.01)
  *H03M 13/29* (2006.01)
  *G06F 11/10* (2006.01)

(56) References Cited

OTHER PUBLICATIONS

International Written Opinion mailed on May 1, 2012 for PCT/JP2012/056933 filed on Mar. 16, 2012.
Michael Yang et al., "Performance of Efficiently Encodable Low-Density Parity-Check Codes in Noise Bursts on the EPR4 Channel", IEEE Transactions on Magnetics, vol. 40, No. 2, Mar. 2004, pp. 507-512.
Sarah J. Johnson, "Burst Erasure Correcting LDPC Codes", IEEE Transactions on Communications, vol. 57, No. 3, Mar. 2009, pp. 641-652.
Takahiro Ohkubo et al., "Application of Low Density Parity Check Codes to High-Density Optical Disc Storage Using 17PP Code", Japanese Journal of Applied Physics, Vo. 45, No. 2B, 2006, pp. 1101-1102.
William E. Ryan and Shu Lin, "Asymptotically Optimal Erasure-Burst-Correction QC-LDPC Codes", Channel Codes Classical and Modern 13.6, 2009, pp. 578-579.
International Preliminary Report on Patentability and Written Opinion issued Sep. 25, 2014, in International application No. PCT/JP2012/056933.

\* cited by examiner $$H1 = \begin{pmatrix} 1 & 1 & 1 & 1 & 0 & 0 & 0 & 0 & 0 & 0 & 0 & 0 \\ 0 & 0 & 0 & 0 & 1 & 1 & 1 & 1 & 0 & 0 & 0 & 0 \\ 0 & 0 & 0 & 0 & 0 & 0 & 0 & 0 & 1 & 1 & 1 & 1 \\ 1 & 1 & 0 & 0 & 0 & 0 & 0 & 1 & 0 & 1 & 0 & 0 \\ 0 & 0 & 0 & 0 & 1 & 0 & 1 & 0 & 1 & 0 & 0 & 1 \\ 0 & 0 & 1 & 1 & 0 & 1 & 0 & 0 & 0 & 0 & 1 & 0 \end{pmatrix}$$

$$H1 = \begin{pmatrix} 1 & 1 & 1 & 1 & 0 & 0 & 0 & 0 & 0 & 0 & 0 & 0 \\ 0 & 0 & 0 & 0 & 1 & 1 & 1 & 1 & 0 & 0 & 0 & 0 \\ 0 & 0 & 0 & 0 & 0 & 0 & 0 & 0 & 1 & 1 & 1 & 1 \\ 1 & 1 & 0 & 0 & 0 & 0 & 0 & 1 & 0 & 1 & 0 & 0 \\ 0 & 0 & 0 & 0 & 1 & 0 & 1 & 0 & 1 & 0 & 0 & 1 \\ 0 & 0 & 1 & 1 & 0 & 1 & 0 & 0 & 0 & 0 & 1 & 0 \end{pmatrix}$$

$$\text{Hsub\_1a} = \begin{pmatrix} - & - & - \\ \times & - & - \\ - & \times & \times \\ \times & - & \times \\ - & \times & - \end{pmatrix}$$

FIG. 3

$$\text{Hsub\_1a} = \begin{pmatrix} - & - & - \\ \times & - & - \\ - & \times & \times \\ \times & - & \times \\ - & \times & - \end{pmatrix} \Rightarrow \text{Hsub\_1b} = \begin{pmatrix} - & - & - \\ \circ & - & - \\ \times & \times & \times \\ - & \circ & \times \\ - & - & - \end{pmatrix}$$

FIG. 4

$$\text{Hsub\_1b} = \begin{pmatrix} - & - & - \\ \circ & - & - \\ \times & \times & \times \\ - & \circ & \times \\ - & - & - \end{pmatrix} \Rightarrow \text{Hsub\_1c} = \begin{pmatrix} - & - & - \\ \circ & \circ & - \\ \circ & - & \times \\ - & \circ & \times \\ - & - & - \end{pmatrix}$$

FIG. 5

$$Hsub\_1c = \begin{pmatrix} - & - & - \\ \circ & & \\ & \circ & \times \\ \circ & & \times \\ - & - & - \\ & \circ & \\ - & - & - \end{pmatrix} \Rightarrow Hsub\_1d = \begin{pmatrix} - & - & - \\ \circ & & \\ \circ & \circ & \circ \\ - & \circ & \\ - & - & - \\ & & \circ \\ - & - & - \end{pmatrix}$$

F I G. 6

$$H1 = \begin{pmatrix} 1 & 1 & 1 & 1 & 0 & 0 & 0 & 0 & 0 & 0 & 0 & 0 \\ 0 & 0 & 0 & 0 & 1 & 1 & 1 & 1 & 0 & 0 & 0 & 0 \\ 0 & 0 & 0 & 0 & 0 & 0 & 0 & 0 & 1 & 1 & 1 & 1 \\ 1 & 1 & 0 & 0 & 0 & 0 & 0 & 1 & 0 & 1 & 0 & 0 \\ 0 & 0 & 0 & 0 & 1 & 0 & 1 & 0 & 1 & 0 & 0 & 1 \\ 0 & 0 & 1 & 1 & 0 & 1 & 0 & 0 & 0 & 0 & 1 & 0 \end{pmatrix}$$

$$Hsub\_2 = \begin{pmatrix} 0 & 0 & 0 \\ 1 & 1 & 1 \\ 0 & 0 & 0 \\ 0 & 0 & 0 \\ 1 & 0 & 1 \\ 0 & 1 & 0 \end{pmatrix}$$

F I G. 7

$$Hsub\_2a = \begin{pmatrix} - & - & - \\ X & X & X \\ - & - & - \\ - & - & - \\ X & - & X \\ - & X & - \end{pmatrix}$$

F I G. 8

$$Hsub\_2a = \begin{pmatrix} - & - & - \\ \boxed{X \quad X \quad X} \\ - & - & - \\ - & - & - \\ X & - & X \\ \boxed{- \quad X \quad -} \end{pmatrix} \Rightarrow Hsub\_2b = \begin{pmatrix} - & - & - \\ X & X & X \\ - & - & - \\ - & - & - \\ X & - & X \\ - & O & - \end{pmatrix}$$

F I G. 9

$$Hsub\_2b = \begin{pmatrix} - & - & - \\ X & X & X \\ - & - & - \\ - & - & - \\ X & - & X \\ - & O & - \end{pmatrix} \Rightarrow Hsub\_2c = \begin{pmatrix} - & - & - \\ X & O & X \\ - & - & - \\ - & - & - \\ X & - & X \\ - & O & - \end{pmatrix}$$

F I G. 10

| First column | Ninth column |
|---|---|
| 1 | 1 |
| 1 | 1 |
| 1 | 1 |
| 1 | 1 |
| 0 | 0 |
| 0 | 0 |
| 0 | 0 |
| 0 | 0 |

| Second column | 10th column |
|---|---|
| 0 | 0 |
| 1 | 1 |
| 1 | 1 |
| 1 | 1 |
| 1 | 1 |
| 0 | 0 |
| 0 | 0 |
| 0 | 0 |

FIG. 11

| | |
|---|---|
| 0 | 0 |
| 1 | 0 |
| 1 | 1 |
| 1 | 1 |
| 1 | 1 |
| 0 | 1 |
| 0 | 0 |
| 0 | 0 |

FIG. 12

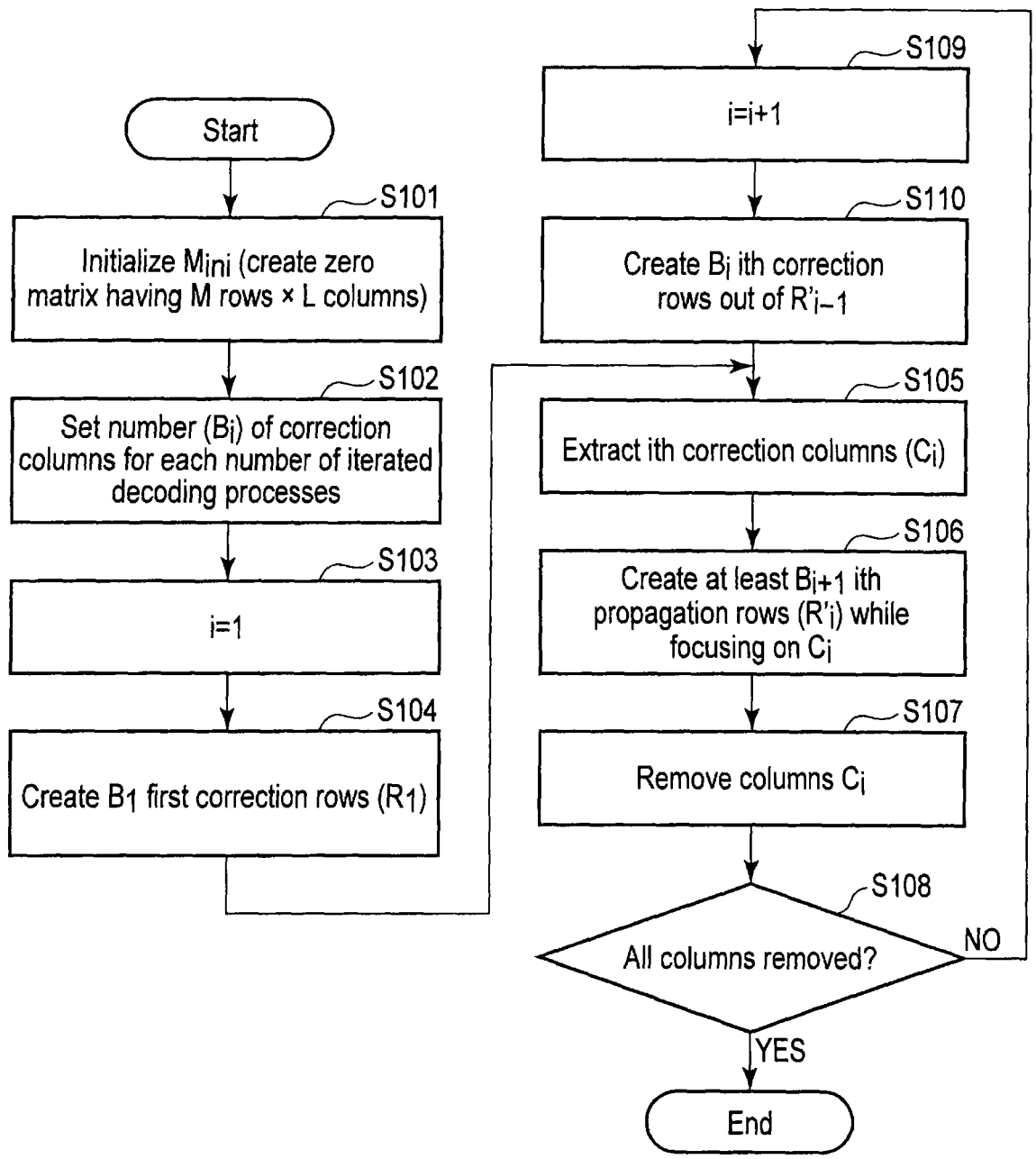
F I G. 13

Third correction column

Third correction row { | 0 | 0 |
| 0 | 0 |
| 1 | 0 |
| 0 | 1 |
| 0 | 0 |
| 0 | 0 |
| 0 | 0 |
| 0 | 0 |
| 0 | 0 |
| 0 | 0 |

F I G. 18

Third correction column

Third propagation row { | 1 | 1 |
| 1 | 1 |
Third correction row { | 1 | 0 |
| 0 | 1 |
| 0 | 0 |
| 0 | 0 |
| 0 | 0 |
| 0 | 0 |
| 0 | 0 |
| 0 | 0 |

F I G. 19

|       | First correction column |   |   | Second correction column |   |   | Third correction column |   |
|---|---|---|---|---|---|---|---|---|
|   | 0 | 0 | 0 | 0 | 0 | 0 | 1 | 1 |
|   | 0 | 0 | 0 | 1 | 0 | 1 | 1 | 1 |
| Third correction row | 0 | 0 | 0 | 0 | 1 | 1 | 1 | 0 |
|   | 0 | 1 | 0 | 1 | 1 | 0 | 0 | 1 |
|   | 0 | 0 | 1 | 1 | 0 | 0 | 0 | 0 |
| Second correction row | 1 | 1 | 0 | 0 | 1 | 0 | 0 | 0 |
|   | 1 | 0 | 1 | 0 | 0 | 1 | 0 | 0 |
|   | 1 | 0 | 0 | 0 | 0 | 0 | 0 | 0 |
| First correction row | 0 | 1 | 0 | 0 | 0 | 0 | 0 | 0 |
|   | 0 | 0 | 1 | 0 | 0 | 0 | 0 | 0 |

F I G. 20

| Column | 1 | | 2 | | 3 | | 4 | | 5 | | 6 | | 7 | | 8 | | 9 | | 10 | | 11 | | 12 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 8 | 17 | 4 | 24 | 2 | 0 | 3 | 0 | 0 | 7 | 2 | 12 | 1 | 13 | 3 | 27 | 1 | 0 | 0 | 13 | 2 | 0 | 3 | 10 |
| | 10 | 10 | 5 | 0 | 11 | 28 | 7 | 8 | 10 | 7 | 6 | 12 | 4 | 26 | 10 | 8 | 7 | 13 | 7 | 17 | 6 | 0 | 8 | 29 |
| | | | | | 12 | 0 | 9 | 21 | 11 | 12 | 8 | 0 | 9 | 0 | 12 | 0 | 12 | 14 | 10 | 16 | 11 | 10 | 9 | 0 |

| Column | 13 | | 14 | | 15 | | 16 | | 17 | | 18 | | 19 | | 20 | | 21 | | 22 | | 23 | | 24 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 13 | 3 | 0 | 5 | 23 | 5 | 5 | 4 | 13 | 3 | 0 | 1 | 27 | 1 | 7 | 1 | 5 | 1 | 0 | 1 | 15 | 5 | 11 |
| | 3 | 0 | 10 | 21 | 8 | 0 | 9 | 0 | 8 | 22 | 5 | 30 | 2 | 15 | 6 | 15 | 5 | 10 | 2 | 21 | 2 | 14 | 7 | 1 |
| | 9 | 30 | 12 | 21 | 12 | 27 | 12 | 26 | 11 | 0 | 10 | 0 | 5 | 0 | 7 | 0 | 11 | 5 | 11 | 21 | 3 | 0 | 8 | 0 |

| Column | 25 | | 26 | | 27 | | 28 | | 29 | | 30 | | 31 | | 32 | | 33 | | 34 | | 35 | | 36 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 13 | 4 | 19 | 6 | 4 | 3 | 0 | 1 | 23 | 8 | 14 | 2 | 31 | 5 | 11 | 4 | 29 | 4 | 0 | 6 | 0 | 6 | 7 |
| | 4 | 0 | 7 | 0 | 9 | 11 | 4 | 22 | 3 | 6 | 9 | 27 | 4 | 0 | 7 | 5 | 8 | 24 | 7 | 26 | 11 | 4 | 8 | 0 |
| | 10 | 30 | 12 | 12 | 10 | 0 | 5 | 16 | 4 | 0 | 11 | 0 | 11 | 23 | 11 | 0 | 12 | 0 | 9 | 29 | 12 | 6 | 12 | 21 |

| Column | 37 | | 38 | | 39 | | 40 | | 41 | | 42 | | 43 | | 44 | | 45 | | 46 | | 47 | | 48 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 5 | 15 | 1 | 0 | 3 | 0 | 2 | 17 | 8 | 0 | 1 | 31 | 1 | 13 | 1 | 0 | 2 | 0 | 4 | 0 | 4 | 24 | 2 | 0 |
| | 6 | 12 | 6 | 9 | 7 | 13 | 6 | 4 | 10 | 23 | 4 | 27 | 9 | 31 | 2 | 24 | 5 | 31 | 9 | 23 | 6 | 25 | 7 | 25 |
| | 10 | 0 | 9 | 27 | 8 | 20 | 7 | 0 | 11 | 4 | 10 | 0 | 12 | 0 | 8 | 21 | 12 | 1 | 10 | 31 | 7 | 0 | 8 | 23 |

| Column | 49 | | 50 | | 51 | | 52 | | 53 | | 54 | | 55 | | 56 | | 57 | | 58 | | 59 | | 60 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 1 | 5 | 25 | 3 | 9 | 1 | 0 | 3 | 14 | 2 | 27 | 1 | 1 | 3 | 8 | 4 | 25 | 7 | 29 | 3 | 29 | 1 | 30 |
| | 3 | 0 | 9 | 3 | 5 | 26 | 11 | 22 | 9 | 28 | 3 | 0 | 5 | 22 | 8 | 1 | 5 | 10 | 9 | 1 | 5 | 21 | 7 | 18 |
| | 11 | 31 | 10 | 0 | 12 | 0 | 12 | 3 | 11 | 0 | 6 | 1 | 6 | 0 | 10 | 0 | 11 | 0 | 12 | 0 | 7 | 0 | 10 | 0 |

| Column | 61 | | 62 | | 63 | | 64 | | 65 | | 66 | | 67 | | 68 | | 69 | | 70 | | 71 | | 72 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 3 | 28 | 2 | 0 | 2 | 29 | 6 | 22 | 5 | 30 | 1 | 3 | 3 | 3 | 2 | 18 | 2 | 27 | 9 | 5 | 6 | 8 | 2 | 9 |
| | 4 | 16 | 4 | 31 | 4 | 0 | 7 | 0 | 6 | 1 | 4 | 0 | 4 | 6 | 8 | 20 | 10 | 0 | 10 | 22 | 8 | 15 | 5 | 0 |
| | 11 | 0 | 6 | 23 | 12 | 7 | 11 | 16 | 8 | 0 | 8 | 2 | 6 | 0 | 9 | 0 | 12 | 19 | 11 | 0 | 9 | 0 | 10 | 3 |

FIG. 22C

| Column | 73 | | 74 | | 75 | | 76 | | 77 | | 78 | | 79 | | 80 | | 81 | | 82 | | 83 | | 84 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 7 | 7 | 27 | 1 | 17 | 3 | 0 | 4 | 18 | 8 | 7 | 1 | 4 | 1 | 5 | 3 | 16 | 1 | 5 | 7 | 0 | 2 | 0 |
| | 5 | 27 | 10 | 21 | 2 | 0 | 9 | 12 | 5 | 27 | 11 | 1 | 5 | 0 | 6 | 0 | 6 | 31 | 3 | 0 | 9 | 26 | 6 | 13 |
| | 8 | 0 | 12 | 0 | 7 | 6 | 12 | 10 | 7 | 0 | 12 | 0 | 10 | 10 | 12 | 16 | 10 | 0 | 9 | 13 | 11 | 0 | 9 | 6 |

| Column | 85 | | 86 | | 87 | | 88 | | 89 | | 90 | | 91 | | 92 | | 93 | | 94 | | 95 | | 96 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 12 | 6 | 5 | 4 | 16 | 7 | 17 | 2 | 7 | 3 | 11 | 1 | 0 | 5 | 24 | 4 | 0 | 3 | 9 | 1 | 0 | 4 | 0 |
| | 3 | 0 | 10 | 23 | 5 | 0 | 8 | 10 | 5 | 0 | 4 | 17 | 2 | 0 | 6 | 0 | 10 | 0 | 4 | 19 | 7 | 29 | 8 | 0 |
| | 11 | 28 | 11 | 0 | 12 | 28 | 10 | 0 | 9 | 11 | 7 | 0 | 11 | 2 | 11 | 0 | 11 | 0 | 8 | 0 | 8 | 0 | 9 | 0 |

| Column | 97 | | 98 | |
|---|---|---|---|---|
| | Row | Shift | Row | Shift |
| Data | 3 | 0 | 5 | 0 |
| | 7 | 0 | 8 | 0 |
| | 12 | 0 | 12 | 0 |

| Column | 1 | | 2 | | 3 | | 4 | | 5 | | 6 | | 7 | | 8 | | 9 | | 10 | | 11 | | 12 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 5 | 31 | 2 | 0 | 1 | 21 | 7 | 2 | 1 | 5 | 1 | 12 | 1 | 0 | 2 | 28 | 3 | 31 | 2 | 13 | 1 | 31 | 1 | 5 |
| | 7 | 18 | 10 | 27 | 4 | 6 | 8 | 0 | 6 | 14 | 7 | 6 | 10 | 21 | 4 | 0 | 5 | 26 | 6 | 28 | 2 | 0 | 2 | 18 |
| | 8 | 0 | 12 | 17 | 6 | 0 | 12 | 21 | 11 | 0 | 12 | 0 | 12 | 28 | 9 | 0 | 8 | 0 | 10 | 0 | 11 | 20 | 10 | 0 |

| Column | 13 | | 14 | | 15 | | 16 | | 17 | | 18 | | 19 | | 20 | | 21 | | 22 | | 23 | | 24 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 7 | 22 | 3 | 1 | 8 | 0 | 6 | 23 | 3 | 13 | 4 | 7 | 3 | 13 | 2 | 15 | 8 | 15 | 1 | 9 | 2 | 26 | 5 | 19 |
| | 9 | 8 | 6 | 0 | 10 | 5 | 8 | 31 | 10 | 21 | 5 | 8 | 4 | 0 | 6 | 0 | 9 | 10 | 3 | 0 | 3 | 24 | 9 | 8 |
| | 11 | 0 | 12 | 7 | 11 | 14 | 9 | 0 | 11 | 0 | 12 | 0 | 11 | 21 | 11 | 2 | 10 | 0 | 9 | 12 | 7 | 0 | 10 | 0 |

| Column | 25 | | 26 | | 27 | | 28 | | 29 | | 30 | | 31 | | 32 | | 33 | | 34 | | 35 | | 36 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 3 | 0 | 1 | 26 | 4 | 15 | 9 | 1 | 1 | 0 | 4 | 11 | 1 | 3 | 3 | 16 | 4 | 26 | 2 | 0 | 2 | 26 | 2 | 2 |
| | 8 | 31 | 2 | 13 | 8 | 3 | 11 | 7 | 8 | 14 | 5 | 14 | 3 | 0 | 5 | 0 | 7 | 11 | 5 | 26 | 3 | 0 | 5 | 0 |
| | 9 | 18 | 5 | 0 | 10 | 0 | 12 | 0 | 11 | 11 | 6 | 0 | 5 | 8 | 10 | 3 | 10 | 0 | 8 | 21 | 12 | 10 | 12 | 12 |

FIG. 23A

| Column | 37 | | 38 | | 39 | | 40 | | 41 | | 42 | | 43 | | 44 | | 45 | | 46 | | 47 | | 48 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 4 | 17 | 1 | 7 | 6 | 8 | 3 | 7 | 4 | 27 | 2 | 29 | 6 | 29 | 3 | 0 | 2 | 20 | 4 | 24 | 2 | 24 | 1 | 13 |
| | 8 | 0 | 6 | 12 | 11 | 19 | 4 | 0 | 5 | 0 | 4 | 2 | 7 | 30 | 7 | 25 | 5 | 0 | 6 | 29 | 6 | 30 | 7 | 23 |
| | 12 | 20 | 9 | 0 | 12 | 0 | 6 | 22 | 9 | 15 | 7 | 0 | 10 | 0 | 12 | 25 | 7 | 28 | 7 | 0 | 8 | 0 | 11 | 0 |

| Column | 49 | | 50 | | 51 | | 52 | | 53 | | 54 | | 55 | | 56 | | 57 | | 58 | | 59 | | 60 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 0 | 3 | 0 | 1 | 3 | 3 | 5 | 1 | 0 | 4 | 0 | 5 | 0 | 6 | 4 | 2 | 1 | 4 | 31 | 1 | 8 | 1 | 6 |
| | 4 | 7 | 7 | 22 | 7 | 0 | 6 | 5 | 4 | 28 | 9 | 17 | 9 | 5 | 7 | 0 | 3 | 26 | 7 | 25 | 4 | 0 | 7 | 4 |
| | 8 | 17 | 10 | 7 | 9 | 5 | 8 | 0 | 11 | 30 | 12 | 19 | 11 | 17 | 11 | 21 | 9 | 0 | 11 | 0 | 10 | 30 | 8 | 0 |

| Column | 61 | | 62 | | 63 | | 64 | | 65 | | 66 | | 67 | | 68 | | 69 | | 70 | | 71 | | 72 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 6 | 6 | 2 | 0 | 1 | 29 | 10 | 4 | 5 | 10 | 7 | 24 | 1 | 2 | 1 | 11 | 1 | 0 | 3 | 11 | 5 | 18 | 2 | 27 |
| | 9 | 13 | 8 | 10 | 4 | 5 | 11 | 29 | 6 | 0 | 8 | 16 | 3 | 0 | 8 | 8 | 9 | 4 | 9 | 0 | 8 | 16 | 3 | 0 |
| | 10 | 0 | 11 | 31 | 7 | 0 | 12 | 0 | 12 | 18 | 9 | 0 | 12 | 15 | 12 | 0 | 10 | 29 | 12 | 6 | 10 | 0 | 11 | 23 |

FIG. 23B

| Column | 73 | | 74 | | 75 | | 76 | | 77 | | 78 | | 79 | | 80 | | 81 | | 82 | | 83 | | 84 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 3 | 22 | 2 | 0 | 1 | 9 | 5 | 22 | 8 | 28 | 5 | 0 | 6 | 12 | 3 | 2 | 5 | 31 | 3 | 21 | 2 | 21 | 2 | 0 |
| | 4 | 26 | 9 | 23 | 5 | 3 | 7 | 12 | 10 | 22 | 7 | 7 | 7 | 0 | 7 | 26 | 10 | 3 | 5 | 0 | 4 | 8 | 6 | 19 |
| | 5 | 0 | 12 | 7 | 6 | 0 | 10 | 0 | 12 | 0 | 9 | 9 | 12 | 1 | 8 | 0 | 12 | 0 | 11 | 26 | 8 | 0 | 9 | 20 |

| Column | 85 | | 86 | | 87 | | 88 | | 89 | | 90 | | 91 | | 92 | | 93 | | 94 | | 95 | | 96 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 12 | 5 | 1 | 5 | 29 | 2 | 0 | 3 | 29 | 2 | 20 | 6 | 2 | 4 | 0 | 8 | 0 | 4 | 23 | 1 | 0 | 2 | 0 |
| | 3 | 5 | 7 | 0 | 11 | 20 | 10 | 31 | 6 | 0 | 4 | 21 | 10 | 17 | 11 | 14 | 9 | 0 | 6 | 0 | 2 | 29 | 7 | 0 |
| | 6 | 0 | 12 | 29 | 12 | 0 | 11 | 9 | 10 | 30 | 10 | 0 | 11 | 0 | 12 | 0 | 11 | 0 | 9 | 0 | 3 | 0 | 9 | 0 |

| Column | 97 | | 98 | |
|---|---|---|---|---|
| | Row | Shift | Row | Shift |
| Data | 1 | 0 | 3 | 0 |
| | 5 | 0 | 4 | 0 |
| | 9 | 0 | 10 | 0 |

FIG. 23C

| Column | 1 | | 2 | | 3 | | 4 | | 5 | | 6 | | 7 | | 8 | | 9 | | 10 | | 11 | | 12 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 3 | 15 | 1 | 13 | 10 | 1 | 4 | 0 | 5 | 9 | 2 | 8 | 8 | 3 | 17 | 14 | 7 | 0 | 1 | 0 | 10 | 11 | 3 | 0 |
| | 9 | 5 | 7 | 4 | 15 | 7 | 12 | 10 | 6 | 10 | 14 | 0 | 13 | 3 | 19 | 3 | 12 | 5 | 5 | 8 | 18 | 2 | 22 | 10 |
| | 16 | 0 | 23 | 0 | 24 | 0 | 18 | 12 | 11 | 0 | 21 | 12 | 20 | 0 | 22 | 0 | 14 | 0 | 9 | 0 | 20 | 0 | 24 | 12 |

| Column | 13 | | 14 | | 15 | | 16 | | 17 | | 18 | | 19 | | 20 | | 21 | | 22 | | 23 | | 24 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 11 | 0 | 2 | 6 | 6 | 5 | 4 | 0 | 3 | 2 | 4 | 11 | 15 | 14 | 6 | 0 | 3 | 8 | 17 | 0 | 13 | 6 | 9 | 3 |
| | 19 | 1 | 8 | 12 | 15 | 15 | 17 | 2 | 5 | 5 | 10 | 3 | 19 | 5 | 21 | 1 | 11 | 0 | 22 | 9 | 14 | 15 | 13 | 0 |
| | 21 | 0 | 16 | 0 | 23 | 0 | 24 | 1 | 7 | 0 | 11 | 0 | 20 | 0 | 22 | 3 | 17 | 11 | 24 | 10 | 18 | 0 | 23 | 8 |

| Column | 25 | | 26 | | 27 | | 28 | | 29 | | 30 | | 31 | | 32 | | 33 | | 34 | | 35 | | 36 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 6 | 12 | 12 | 8 | 3 | 0 | 14 | 10 | 5 | 8 | 10 | 12 | 7 | 13 | 1 | 0 | 2 | 6 | 4 | 15 | 2 | 1 | 1 | 1 |
| | 12 | 4 | 20 | 9 | 4 | 14 | 16 | 10 | 8 | 4 | 17 | 0 | 13 | 2 | 15 | 11 | 5 | 5 | 11 | 11 | 11 | 15 | 2 | 0 |
| | 19 | 0 | 21 | 0 | 8 | 0 | 23 | 0 | 10 | 0 | 21 | 11 | 19 | 0 | 16 | 10 | 12 | 0 | 22 | 0 | 24 | 0 | 20 | 10 |

F I G. 24A

| Column | 37 | | 38 | | 39 | | 40 | | 41 | | 42 | | 43 | | 44 | | 45 | | 46 | | 47 | | 48 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 6 | 8 | 8 | 8 | 5 | 0 | 3 | 15 | 9 | 4 | 12 | 4 | 4 | 10 | 2 | 2 | 9 | 2 | 1 | 0 | 7 | 2 | 5 | 7 |
| | 7 | 0 | 11 | 12 | 18 | 8 | 8 | 0 | 18 | 7 | 3 | 0 | 8 | 2 | 3 | 0 | 12 | 12 | 14 | 4 | 9 | 0 | 15 | 7 |
| | 18 | 9 | 17 | 0 | 22 | 6 | 21 | 10 | 19 | 0 | 6 | 0 | 22 | 12 | 10 | 0 | 0 | 15 | 24 | 8 | 20 | 10 | 17 | 0 |

... ... ...

| Column | 49 | | 50 | | 51 | | 52 | | 53 | | 54 | | 55 | | 56 | | 57 | | 58 | | 59 | | 60 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 4 | 12 | 5 | 5 | 10 | 0 | 8 | 15 | 1 | 8 | 8 | 16 | 3 | 15 | 5 | 0 | 7 | 0 | 1 | 1 | 9 | 8 | 8 | 8 |
| | 17 | 6 | 23 | 9 | 12 | 12 | 0 | 0 | 6 | 9 | 18 | 15 | 15 | 11 | 15 | 5 | 10 | 15 | 10 | 0 | 14 | 0 | 14 | 9 |
| | 21 | 0 | 24 | 0 | 22 | 6 | 12 | 0 | 13 | 0 | 24 | 0 | 21 | 3 | 21 | 5 | 16 | 1 | 19 | 3 | 17 | 13 | 15 | 0 |

... ... ...

| Column | 61 | | 62 | | 63 | | 64 | | 65 | | 66 | | 67 | | 68 | | 69 | | 70 | | 71 | | 72 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 5 | 14 | 3 | 6 | 1 | 3 | 13 | 10 | 4 | 2 | 2 | 3 | 8 | 13 | 1 | 0 | 5 | 0 | 4 | 1 | 5 | 2 | 3 | 5 |
| | 14 | 15 | 4 | 0 | 11 | 0 | 16 | 0 | 19 | 0 | 18 | 1 | 9 | 13 | 12 | 9 | 20 | 1 | 14 | 3 | 21 | 0 | 12 | 14 |
| | 19 | 0 | 14 | 15 | 18 | 6 | 22 | 11 | 23 | 12 | 23 | 0 | 24 | 0 | 17 | 8 | 23 | 10 | 15 | 0 | 24 | 15 | 23 | 0 |

| Column | 73 | | 74 | | 75 | | 76 | | 77 | | 78 | | 79 | | 80 | | 81 | | 82 | | 83 | | 84 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 3 | 0 | 6 | 0 | 7 | 5 | 11 | 13 | 9 | 0 | 8 | 12 | 4 | 9 | 6 | 7 | 11 | 11 | 8 | 0 | 4 | 3 | 3 | 3 |
| | 6 | 5 | 16 | 7 | 15 | 0 | 16 | 10 | 21 | 9 | 9 | 2 | 5 | 0 | 9 | 2 | 13 | 6 | 21 | 5 | 9 | 0 | 13 | 0 |
| | 20 | 15 | 17 | 3 | 22 | 12 | 20 | 0 | 24 | 4 | 14 | 0 | 13 | 15 | 10 | 0 | 15 | 0 | 23 | 0 | 20 | 3 | 19 | 1 |

| Column | 85 | | 86 | | 87 | | 88 | | 89 | | 90 | | 91 | | 92 | | 93 | | 94 | | 95 | | 96 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 4 | 14 | 2 | 2 | 3 | 7 | 7 | 20 | 5 | 1 | 0 | 5 | 2 | 11 | 10 | 4 | 0 | 12 | 11 | 2 | 0 | 0 | 2 |
| | 7 | 7 | 20 | 5 | 9 | 0 | 18 | 9 | 23 | 11 | 8 | 11 | 8 | 0 | 14 | 6 | 20 | 5 | 13 | 5 | 16 | 3 | 10 | 1 |
| | 17 | 0 | 22 | 0 | 22 | 2 | 21 | 0 | 24 | 0 | 18 | 11 | 23 | 13 | 23 | 0 | 24 | 13 | 16 | 0 | 19 | 0 | 13 | 3 |

| Column | 97 | | 98 | | 99 | | 100 | | 101 | | 102 | | 103 | | 104 | | 105 | | 106 | | 107 | | 108 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 6 | 0 | 6 | 3 | 2 | 0 | 10 | 0 | 6 | 6 | 6 | 5 | 3 | 0 | 4 | 10 | 2 | 7 | 3 | 14 | 13 | 5 | 10 | 6 |
| | 7 | 0 | 8 | 9 | 20 | 3 | 22 | 12 | 13 | 0 | 10 | 3 | 15 | 1 | 7 | 0 | 9 | 10 | 17 | 5 | 17 | 12 | 11 | 4 |
| | 24 | 7 | 19 | 0 | 22 | 3 | 23 | 11 | 21 | 11 | 14 | 0 | 18 | 0 | 16 | 13 | 11 | 0 | 18 | 0 | 20 | 0 | 13 | 0 |

| Column | 109 | | 110 | | 111 | | 112 | | 113 | | 114 | | 115 | | 116 | | 117 | | 118 | | 119 | | 120 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 2 | 16 | 13 | 7 | 1 | 1 | 14 | 1 | 7 | 7 | 10 | 3 | 5 | 1 | 0 | 2 | 10 | 9 | 4 | 7 | 0 | 7 | 2 |
| | 13 | 9 | 18 | 13 | 9 | 13 | 3 | 0 | 5 | 9 | 10 | 14 | 19 | 11 | 12 | 12 | 6 | 0 | 11 | 13 | 13 | 12 | 8 | 13 |
| | 14 | 0 | 21 | 0 | 11 | 0 | 22 | 15 | 16 | 0 | 19 | 0 | 24 | 0 | 21 | 11 | 15 | 7 | 13 | 0 | 24 | 6 | 12 | 0 |

| Column | 121 | | 122 | | 123 | | 124 | | 125 | | 126 | | 127 | | 128 | | 129 | | 130 | | 131 | | 132 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 16 | 15 | 1 | 3 | 1 | 10 | 14 | 5 | 17 | 15 | 5 | 2 | 9 | 12 | 5 | 5 | 1 | 2 | 3 | 7 | 6 | 0 | 12 | 0 |
| | 17 | 2 | 4 | 0 | 10 | 11 | 18 | 3 | 18 | 11 | 16 | 0 | 17 | 8 | 11 | 7 | 3 | 0 | 5 | 0 | 16 | 12 | 15 | 11 |
| | 23 | 0 | 19 | 2 | 15 | 0 | 19 | 0 | 23 | 0 | 20 | 1 | 19 | 0 | 24 | 0 | 7 | 12 | 9 | 11 | 22 | 14 | 20 | 15 |

| Column | 133 | | 134 | | 135 | | 136 | | 137 | | 138 | | 139 | | 140 | | 141 | | 142 | | 143 | | 144 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 5 | 4 | 6 | 3 | 4 | 3 | 1 | 0 | 5 | 2 | 14 | 0 | 2 | 14 | 1 | 13 | 1 | 10 | 2 | 13 | 10 | 1 | 9 | 2 |
| | 13 | 0 | 12 | 2 | 10 | 9 | 11 | 0 | 7 | 0 | 21 | 1 | 8 | 13 | 13 | 7 | 3 | 0 | 12 | 0 | 12 | 0 | 10 | 15 |
| | 24 | 9 | 18 | 0 | 23 | 0 | 23 | 7 | 17 | 7 | 22 | 4 | 15 | 0 | 24 | 11 | 13 | 15 | 19 | 9 | 14 | 0 | 18 | 0 |

F I G. 24D

| Column | 145 | | 146 | | 147 | | 148 | | 149 | | 150 | | 151 | | 152 | | 153 | | 154 | | 155 | | 156 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 4 | 0 | 7 | 5 | 9 | 7 | 6 | 12 | 8 | 11 | 3 | 4 | 1 | 0 | 3 | 1 | 15 | 8 | 1 | 7 | 8 | 9 | 11 | 4 |
| | 12 | 8 | 11 | 0 | 15 | 0 | 17 | 0 | 18 | 0 | 13 | 2 | 17 | 2 | 11 | 1 | 19 | 8 | 6 | 6 | 13 | 0 | 15 | 0 |
| | 16 | 10 | 20 | 2 | 23 | 13 | 20 | 13 | 24 | 7 | 23 | 0 | 24 | 3 | 12 | 0 | 22 | 0 | 9 | 0 | 17 | 2 | 18 | 0 |

| Column | 157 | | 158 | | 159 | | 160 | | 161 | | 162 | | 163 | | 164 | | 165 | | 166 | | 167 | | 168 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 11 | 1 | 15 | 5 | 12 | 10 | 5 | 8 | 0 | 6 | 13 | 2 | 2 | 7 | 7 | 4 | 3 | 4 | 10 | 11 | 8 | 9 | 11 |
| | 4 | 0 | 2 | 2 | 6 | 3 | 20 | 8 | 18 | 6 | 8 | 10 | 6 | 0 | 22 | 0 | 5 | 0 | 13 | 8 | 14 | 9 | 12 | 2 |
| | 21 | 10 | 8 | 0 | 14 | 0 | 21 | 0 | 20 | 0 | 24 | 0 | 23 | 9 | 23 | 0 | 18 | 7 | 15 | 0 | 16 | 0 | 22 | 0 |

| Column | 169 | | 170 | | 171 | | 172 | | 173 | | 174 | | 175 | | 176 | | 177 | | 178 | | 179 | | 180 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 0 | 2 | 10 | 8 | 4 | 14 | 9 | 10 | 12 | 3 | 0 | 13 | 0 | 9 | 8 | 14 | 1 | 5 | 0 | 7 | 8 | 1 | 0 |
| | 20 | 12 | 18 | 0 | 10 | 15 | 19 | 21 | 16 | 11 | 14 | 3 | 18 | 0 | 16 | 0 | 15 | 15 | 19 | 6 | 8 | 13 | 7 | 8 |
| | 21 | 15 | 24 | 8 | 21 | 0 | 23 | 0 | 24 | 0 | 20 | 13 | 22 | 3 | 21 | 4 | 17 | 0 | 22 | 13 | 16 | 0 | 21 | 6 |

FIG. 24E

| Column | 181 | | 182 | | 183 | | 184 | | 185 | | 186 | | 187 | | 188 | | 189 | | 190 | | 191 | | 192 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 4 | 11 | 7 | 4 | 16 | 14 | 3 | 10 | 6 | 3 | 12 | 0 | 5 | 0 | 10 | 0 | 3 | 3 | 1 | 0 | 1 | 0 | 2 | 0 |
| | 7 | 0 | 8 | 0 | 19 | 0 | 10 | 0 | 11 | 0 | 19 | 0 | 12 | 7 | 12 | 0 | 4 | 0 | 14 | 0 | 4 | 1 | 7 | 0 |
| | 14 | 7 | 10 | 0 | 20 | 0 | 16 | 0 | 22 | 11 | 24 | 0 | 13 | 0 | 17 | 0 | 6 | 0 | 22 | 0 | 9 | 0 | 15 | 0 |

| Column | 193 | | 194 | | 195 | | 196 | |
|---|---|---|---|---|---|---|---|---|
| | Row | Shift | Row | Shift | Row | Shift | Row | Shift |
| Data | 4 | 0 | 11 | 0 | 2 | 0 | 2 | 0 |
| | 9 | 0 | 19 | 0 | 3 | 0 | 5 | 0 |
| | 21 | 0 | 23 | 0 | 22 | 0 | 17 | 0 |

| Column | 1 | | 2 | | 3 | | 4 | | 5 | | 6 | | 7 | | 8 | | 9 | | 10 | | 11 | | 12 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 11 | 5 | 0 | 7 | 0 | 11 | 0 | 12 | 0 | 6 | 5 | 1 | 0 | 6 | 10 | 2 | 6 | 2 | 2 | 5 | 12 | 4 | 0 |
| | 3 | 0 | 7 | 9 | 13 | 15 | 16 | 5 | 20 | 15 | 8 | 12 | 9 | 0 | 12 | 0 | 13 | 0 | 7 | 4 | 14 | 1 | 19 | 8 |
| | 18 | 4 | 13 | 0 | 24 | 2 | 18 | 3 | 23 | 1 | 14 | 0 | 13 | 4 | 20 | 4 | 24 | 8 | 21 | 0 | 24 | 0 | 22 | 3 |

| Column | 13 | | 14 | | 15 | | 16 | | 17 | | 18 | | 19 | | 20 | | 21 | | 22 | | 23 | | 24 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 14 | 16 | 0 | 9 | 14 | 2 | 10 | 2 | 0 | 6 | 0 | 7 | 0 | 5 | 6 | 2 | 2 | 1 | 7 | 3 | 4 | 13 | 14 |
| | 8 | 0 | 19 | 1 | 10 | 3 | 3 | 9 | 9 | 11 | 17 | 8 | 12 | 12 | 10 | 0 | 6 | 6 | 13 | 13 | 15 | 1 | 14 | 13 |
| | 17 | 6 | 21 | 2 | 19 | 0 | 21 | 0 | 24 | 0 | 22 | 5 | 18 | 13 | 15 | 2 | 14 | 0 | 15 | 0 | 20 | 0 | 21 | 0 |

| Column | 25 | | 26 | | 27 | | 28 | | 29 | | 30 | | 31 | | 32 | | 33 | | 34 | | 35 | | 36 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 9 | 4 | 10 | 10 | 3 | 10 | 0 | 6 | 8 | 4 | 12 | 3 | 2 | 4 | 15 | 2 | 0 | 4 | 1 | 8 | 1 | 3 | 1 |
| | 5 | 8 | 11 | 0 | 17 | 2 | 14 | 0 | 10 | 14 | 12 | 8 | 5 | 0 | 15 | 13 | 5 | 8 | 20 | 6 | 16 | 0 | 8 | 0 |
| | 9 | 0 | 23 | 6 | 23 | 0 | 22 | 0 | 24 | 0 | 16 | 6 | 6 | 0 | 18 | 0 | 19 | 6 | 21 | 6 | 22 | 0 | 19 | 13 |

| Column | 37 | | 38 | | 39 | | 40 | | 41 | | 42 | | 43 | | 44 | | 45 | | 46 | | 47 | | 48 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 6 | 12 | 8 | 5 | 2 | 4 | 11 | 12 | 1 | 0 | 3 | 6 | 9 | 15 | 7 | 12 | 2 | 13 | 15 | 3 | 4 | 16 | 7 |
| | 9 | 0 | 15 | 0 | 15 | 14 | 20 | 11 | 7 | 0 | 11 | 5 | 11 | 12 | 10 | 1 | 3 | 0 | 18 | 15 | 5 | 12 | 17 | 9 |
| | 19 | 9 | 21 | 10 | 19 | 0 | 22 | 0 | 23 | 13 | 14 | 0 | 15 | 0 | 16 | 0 | 22 | 0 | 23 | 0 | 8 | 0 | 20 | 0 |

...

| Column | 49 | | 50 | | 51 | | 52 | | 53 | | 54 | | 55 | | 56 | | 57 | | 58 | | 59 | | 60 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 21 | 5 | 8 | 3 | 4 | 11 | 11 | 7 | 2 | 3 | 18 | 15 | 5 | 3 | 1 | 0 | 2 | 0 | 5 | 0 | 1 | 15 | 1 | 0 |
| | 22 | 9 | 11 | 13 | 7 | 0 | 12 | 2 | 8 | 1 | 19 | 4 | 16 | 3 | 5 | 7 | 8 | 2 | 18 | 8 | 4 | 9 | 19 | 13 |
| | 23 | 0 | 24 | 0 | 17 | 12 | 17 | 0 | 18 | 0 | 20 | 0 | 22 | 0 | 21 | 3 | 20 | 13 | 20 | 2 | 6 | 0 | 20 | 12 |

...

| Column | 61 | | 62 | | 63 | | 64 | | 65 | | 66 | | 67 | | 68 | | 69 | | 70 | | 71 | | 72 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 15 | 0 | 16 | 0 | 10 | 11 | 7 | 0 | 4 | 14 | 3 | 9 | 1 | 0 | 6 | 6 | 2 | 2 | 17 | 0 | 1 | 8 | 8 | 7 |
| | 17 | 12 | 23 | 14 | 18 | 13 | 14 | 6 | 8 | 1 | 4 | 12 | 18 | 0 | 11 | 14 | 4 | 0 | 19 | 1 | 2 | 0 | 10 | 0 |
| | 24 | 4 | 24 | 0 | 21 | 0 | 15 | 3 | 9 | 0 | 10 | 0 | 22 | 2 | 13 | 0 | 23 | 5 | 23 | 0 | 17 | 1 | 12 | 6 |

| Column | 73 | | 74 | | 75 | | 76 | | 77 | | 78 | | 79 | | 80 | | 81 | | 82 | | 83 | | 84 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 12 | 0 | 12 | 8 | 5 | 5 | 10 | 12 | 1 | 3 | 18 | 5 | 10 | 0 | 20 | 10 | 6 | 0 | 12 | 10 | 13 | 7 | 4 | 13 |
| | 14 | 1 | 13 | 0 | 17 | 2 | 17 | 4 | 10 | 0 | 21 | 0 | 13 | 5 | 21 | 13 | 15 | 3 | 15 | 0 | 16 | 2 | 22 | 6 |
| | 19 | 4 | 22 | 13 | 18 | 0 | 21 | 0 | 24 | 1 | 24 | 0 | 20 | 0 | 24 | 0 | 16 | 2 | 23 | 15 | 17 | 0 | 24 | 0 |

...

| Column | 85 | | 86 | | 87 | | 88 | | 89 | | 90 | | 91 | | 92 | | 93 | | 94 | | 95 | | 96 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 0 | 7 | 6 | 3 | 15 | 3 | 0 | 1 | 13 | 5 | 11 | 3 | 10 | 9 | 7 | 1 | 14 | 7 | 12 | 7 | 6 | 9 | 5 |
| | 22 | 15 | 9 | 0 | 15 | 11 | 16 | 7 | 2 | 8 | 11 | 7 | 4 | 0 | 14 | 3 | 4 | 0 | 8 | 0 | 11 | 6 | 17 | 13 |
| | 24 | 8 | 22 | 3 | 12 | 0 | 23 | 10 | 12 | 0 | 13 | 0 | 23 | 0 | 21 | 4 | 11 | 0 | 19 | 0 | 20 | 0 | | |

...

| Column | 97 | | 98 | | 99 | | 100 | | 101 | | 102 | | 103 | | 104 | | 105 | | 106 | | 107 | | 108 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 0 | 4 | 5 | 9 | 12 | 3 | 3 | 12 | 0 | 1 | 0 | 6 | 5 | 14 | 12 | 3 | 0 | 7 | 0 | 9 | 15 | 3 | 8 |
| | 11 | 3 | 7 | 0 | 13 | 0 | 7 | 0 | 19 | 3 | 12 | 2 | 8 | 0 | 15 | 10 | 14 | 11 | 9 | 12 | 16 | 0 | 23 | 4 |
| | 16 | 1 | 24 | 0 | 18 | 0 | 22 | 11 | 24 | 0 | 14 | 5 | 23 | 9 | 16 | 0 | 17 | 1 | 14 | 0 | 24 | 9 | 24 | 0 |

...

F I G. 25C

| Column | 109 | | 110 | | 111 | | 112 | | 113 | | 114 | | 115 | | 116 | | 117 | | 118 | | 119 | | 120 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 3 | 9 | 0 | 5 | 1 | 4 | 1 | 13 | 9 | 3 | 1 | 2 | 0 | 6 | 11 | 1 | 14 | 6 | 2 | 11 | 3 | 5 | 0 |
| | 3 | 0 | 16 | 9 | 10 | 9 | 5 | 10 | 15 | 15 | 12 | 7 | 12 | 5 | 7 | 0 | 11 | 0 | 15 | 0 | 13 | 9 | 19 | 2 |
| | 16 | 1 | 23 | 4 | 11 | 0 | 14 | 0 | 19 | 0 | 24 | 0 | 21 | 15 | 20 | 4 | 15 | 10 | 22 | 5 | 21 | 0 | 23 | 10 |

...

| Column | 121 | | 122 | | 123 | | 124 | | 125 | | 126 | | 127 | | 128 | | 129 | | 130 | | 131 | | 132 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 6 | 0 | 14 | 0 | 9 | 3 | 1 | 0 | 8 | 4 | 15 | 14 | 14 | 14 | 5 | 0 | 3 | 10 | 1 | 0 | 4 | 2 | 4 | 0 |
| | 17 | 9 | 18 | 3 | 12 | 15 | 14 | 11 | 10 | 9 | 18 | 0 | 20 | 4 | 6 | 3 | 12 | 14 | 14 | 14 | 5 | 0 | 17 | 13 |
| | 18 | 11 | 19 | 11 | 18 | 0 | 16 | 13 | 13 | 0 | 23 | 5 | 23 | 0 | 12 | 0 | 16 | 0 | 20 | 4 | 20 | 0 | 19 | 9 |

...

| Column | 133 | | 134 | | 135 | | 136 | | 137 | | 138 | | 139 | | 140 | | 141 | | 142 | | 143 | | 144 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 7 | 9 | 1 | 7 | 6 | 5 | 6 | 0 | 2 | 7 | 8 | 5 | 4 | 0 | 8 | 11 | 2 | 12 | 8 | 8 | 4 | 0 | 2 | 13 |
| | 8 | 4 | 5 | 0 | 19 | 11 | 11 | 10 | 11 | 0 | 15 | 12 | 6 | 15 | 16 | 0 | 15 | 14 | 14 | 8 | 10 | 12 | 10 | 3 |
| | 17 | 0 | 23 | 9 | 21 | 0 | 24 | 5 | 22 | 7 | 22 | 0 | 13 | 0 | 18 | 1 | 17 | 0 | 20 | 0 | 18 | 0 | 20 | 0 |

...

F I G. 25D

| Column | 145 | | 146 | | 147 | | 148 | | 149 | | 150 | | 151 | | 152 | | 153 | | 154 | | 155 | | 156 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 9 | 6 | 8 | 0 | 10 | 0 | 5 | 4 | 8 | 9 | 3 | 0 | 2 | 10 | 10 | 0 | 4 | 8 | 9 | 13 | 5 | 0 | 1 | 5 |
| | 10 | 13 | 13 | 11 | 13 | 11 | 13 | 0 | 13 | 2 | 11 | 10 | 7 | 0 | 11 | 0 | 9 | 2 | 17 | 14 | 7 | 8 | 6 | 7 |
| | 22 | 0 | 23 | 14 | 14 | 6 | 22 | 5 | 20 | 0 | 17 | 12 | 12 | 10 | 23 | 8 | 15 | 0 | 21 | 0 | 15 | 7 | 7 | 0 |

...

| Column | 157 | | 158 | | 159 | | 160 | | 161 | | 162 | | 163 | | 164 | | 165 | | 166 | | 167 | | 168 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 3 | 13 | 14 | 9 | 2 | 7 | 11 | 9 | 3 | 14 | 7 | 11 | 2 | 0 | 2 | 4 | 5 | 0 | 3 | 3 | 11 | 14 | 2 | 10 |
| | 7 | 9 | 18 | 6 | 14 | 0 | 15 | 14 | 6 | 0 | 16 | 1 | 3 | 5 | 3 | 0 | 8 | 0 | 10 | 12 | 14 | 6 | 6 | 0 |
| | 19 | 0 | 24 | 0 | 22 | 12 | 20 | 0 | 21 | 8 | 21 | 0 | 13 | 2 | 20 | 2 | 24 | 2 | 20 | 0 | 21 | 0 | 10 | 14 |

...

| Column | 169 | | 170 | | 171 | | 172 | | 173 | | 174 | | 175 | | 176 | | 177 | | 178 | | 179 | | 180 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 3 | 13 | 8 | 4 | 12 | 6 | 6 | 4 | 12 | 8 | 5 | 0 | 4 | 12 | 4 | 7 | 19 | 9 | 1 | 0 | 6 | 0 | 11 | 0 |
| | 10 | 0 | 12 | 0 | 13 | 4 | 7 | 0 | 15 | 5 | 17 | 11 | 9 | 0 | 12 | 0 | 21 | 13 | 8 | 7 | 16 | 7 | 18 | 0 |
| | 15 | 3 | 21 | 3 | 17 | 0 | 23 | 3 | 21 | 0 | 22 | 14 | 11 | 0 | 22 | 8 | 22 | 0 | 19 | 12 | 20 | 4 | 19 | 1 |

...

F I G. 25E

| Column | 181 | | 182 | | 183 | | 184 | | 185 | | 186 | | 187 | | 188 | | 189 | | 190 | | 191 | | 192 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 10 | 10 | 2 | 0 | 13 | 8 | 6 | 0 | 10 | 0 | 1 | 10 | 17 | 0 | 4 | 0 | 4 | 0 | 7 | 0 | 3 | 0 | 0 | 0 |
| | 16 | 8 | 7 | 4 | 16 | 5 | 18 | 12 | 12 | 4 | 8 | 0 | 19 | 2 | 6 | 0 | 14 | 0 | 20 | 0 | 5 | 0 | 8 | 0 |
| | 19 | 0 | 18 | 0 | 21 | 0 | 22 | 7 | 15 | 0 | 12 | 0 | 24 | 0 | 16 | 0 | 17 | 0 | 22 | 0 | 18 | 0 | 15 | 1 |

| Column | 193 | | 194 | | 195 | | 196 | |
|---|---|---|---|---|---|---|---|---|
| | Row | Shift | Row | Shift | Row | Shift | Row | Shift |
| Data | 13 | 0 | 5 | 0 | 1 | 0 | 15 | 0 |
| | 19 | 0 | 21 | 0 | 19 | 0 | 23 | 0 |
| | 24 | 0 | 23 | 0 | 22 | 0 | 24 | 0 |

FIG. 25F

| Column | 1 | | 2 | | 3 | | 4 | | 5 | | 6 | | 7 | | 8 | | 9 | | 10 | | 11 | | 12 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 10 | 2 | 5 | 0 | 14 | 0 | 18 | 0 | 26 | 6 | 31 | 7 | 22 | 2 | 28 | 3 | 15 | 4 | 12 | 0 | 6 | 6 | 3 | 0 |
| | 17 | 3 | 24 | 2 | 23 | 3 | 38 | 7 | 29 | 0 | 32 | 0 | 30 | 6 | 41 | 3 | 21 | 2 | 36 | 0 | 16 | 5 | 7 | 0 |
| | 37 | 0 | 33 | 6 | 39 | 5 | 42 | 7 | 45 | 6 | 43 | 7 | 34 | 0 | 48 | 0 | 27 | 0 | 47 | 2 | 44 | 0 | 46 | 0 |

| Column | 13 | | 14 | | 15 | | 16 | | 17 | | 18 | | 19 | | 20 | | 21 | | 22 | | 23 | | 24 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 3 | 4 | 3 | 11 | 6 | 2 | 0 | 17 | 6 | 6 | 0 | 35 | 1 | 18 | 7 | 3 | 7 | 1 | 0 | 19 | 0 | 10 | 5 |
| | 13 | 0 | 19 | 5 | 25 | 6 | 8 | 5 | 40 | 1 | 7 | 2 | 39 | 2 | 28 | 2 | 5 | 1 | 25 | 5 | 29 | 6 | 13 | 2 |
| | 40 | 2 | 20 | 0 | 35 | 0 | 9 | 0 | 46 | 0 | 30 | 0 | 44 | 0 | 34 | 0 | 45 | 0 | 37 | 0 | 31 | 2 | 26 | 0 |

| Column | 25 | | 26 | | 27 | | 28 | | 29 | | 30 | | 31 | | 32 | | 33 | | 34 | | 35 | | 36 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 21 | 7 | 20 | 2 | 11 | 1 | 9 | 0 | 4 | 4 | 16 | 3 | 2 | 0 | 8 | 0 | 16 | 6 | 12 | 5 | 9 | 1 | 3 | 0 |
| | 22 | 4 | 32 | 4 | 12 | 2 | 15 | 1 | 14 | 0 | 27 | 3 | 23 | 7 | 24 | 7 | 24 | 0 | 25 | 6 | 10 | 5 | 23 | 6 |
| | 36 | 0 | 41 | 0 | 42 | 0 | 43 | 5 | 48 | 3 | 38 | 0 | 33 | 6 | 26 | 4 | 45 | 2 | 30 | 0 | 40 | 0 | 28 | 0 |

FIG. 26A

| Column | 37 | | 38 | | 39 | | 40 | | 41 | | 42 | | 43 | | 44 | | 45 | | 46 | | 47 | | 48 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 8 | 1 | 1 | 0 | 4 | 6 | 15 | 2 | 33 | 5 | 6 | 0 | 2 | 3 | 8 | 0 | 5 | 3 | 8 | 2 | 9 | 3 | 7 | 0 |
| | 11 | 6 | 31 | 5 | 5 | 0 | 18 | 2 | 37 | 4 | 13 | 2 | 7 | 0 | 37 | 3 | 9 | 5 | 10 | 6 | 10 | 4 | 26 | 2 |
| | 17 | 0 | 39 | 1 | 42 | 5 | 35 | 0 | 46 | 0 | 29 | 1 | 17 | 5 | 40 | 3 | 11 | 0 | 40 | 0 | 46 | 0 | 33 | 0 |

| Column | 49 | | 50 | | 51 | | 52 | | 53 | | 54 | | 55 | | 56 | | 57 | | 58 | | 59 | | 60 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 20 | 4 | 19 | 7 | 3 | 0 | 34 | 4 | 27 | 6 | 2 | 0 | 6 | 3 | 4 | 3 | 25 | 7 | 23 | 0 | 7 | 7 | 16 | 0 |
| | 43 | 0 | 41 | 5 | 24 | 3 | 44 | 2 | 32 | 0 | 31 | 3 | 14 | 1 | 15 | 3 | 39 | 6 | 30 | 7 | 13 | 0 | 41 | 5 |
| | 44 | 0 | 47 | 0 | 29 | 0 | 47 | 0 | 36 | 0 | 48 | 6 | 22 | 0 | 38 | 0 | 45 | 0 | 37 | 0 | 35 | 1 | 42 | 1 |

| Column | 61 | | 62 | | 63 | | 64 | | 65 | | 66 | | 67 | | 68 | | 69 | | 70 | | 71 | | 72 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 12 | 6 | 2 | 0 | 8 | 1 | 24 | 5 | 18 | 5 | 32 | 0 | 11 | 7 | 1 | 0 | 3 | 0 | 2 | 5 | 20 | 1 | 27 | 1 |
| | 28 | 5 | 37 | 5 | 13 | 0 | 28 | 1 | 19 | 1 | 47 | 0 | 14 | 3 | 5 | 1 | 42 | 6 | 26 | 0 | 21 | 6 | 34 | 2 |
| | 29 | 0 | 46 | 6 | 46 | 4 | 35 | 0 | 22 | 0 | 48 | 3 | 33 | 0 | 22 | 2 | 43 | 0 | 40 | 6 | 38 | 0 | 45 | 0 |

F I G. 26B

| Column | 73 | | 74 | | 75 | | 76 | | 77 | | 78 | | 79 | | 80 | | 81 | | 82 | | 83 | | 84 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 6 | 0 | 14 | 6 | 1 | 1 | 12 | 7 | 10 | 0 | 3 | 7 | 4 | 7 | 19 | 7 | 2 | 0 | 7 | 6 | 14 | 6 | 6 | 2 |
| | 23 | 1 | 15 | 0 | 17 | 0 | 21 | 5 | 30 | 1 | 9 | 0 | 18 | 2 | 21 | 6 | 13 | 4 | 11 | 0 | 17 | 0 | 20 | 4 |
| | 48 | 7 | 41 | 1 | 43 | 1 | 31 | 0 | 33 | 0 | 30 | 1 | 25 | 0 | 39 | 0 | 33 | 2 | 29 | 1 | 35 | 4 | 26 | 0 |

| Column | 85 | | 86 | | 87 | | 88 | | 89 | | 90 | | 91 | | 92 | | 93 | | 94 | | 95 | | 96 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 38 | 4 | 20 | 7 | 8 | 7 | 5 | 0 | 13 | 5 | 26 | 0 | 7 | 5 | 9 | 2 | 9 | 0 | 30 | 7 | 1 | 1 | 32 | 5 |
| | 41 | 5 | 23 | 5 | 26 | 5 | 29 | 2 | 24 | 0 | 40 | 1 | 22 | 1 | 26 | 4 | 13 | 3 | 35 | 4 | 21 | 0 | 38 | 3 |
| | 44 | 0 | 34 | 0 | 37 | 0 | 48 | 3 | 30 | 5 | 46 | 4 | 28 | 0 | 37 | 0 | 23 | 0 | 46 | 0 | 47 | 3 | 39 | 0 |

| Column | 97 | | 98 | | 99 | | 100 | | 101 | | 102 | | 103 | | 104 | | 105 | | 106 | | 107 | | 108 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 3 | 3 | 31 | 6 | 16 | 0 | 12 | 0 | 17 | 0 | 19 | 0 | 25 | 7 | 33 | 3 | 7 | 4 | 15 | 6 | 14 | 7 | 2 | 0 |
| | 10 | 2 | 34 | 0 | 36 | 7 | 24 | 7 | 22 | 0 | 27 | 5 | 27 | 0 | 35 | 4 | 8 | 7 | 36 | 7 | 28 | 1 | 26 | 5 |
| | 11 | 0 | 36 | 0 | 43 | 0 | 32 | 4 | 48 | 0 | 44 | 2 | 47 | 2 | 40 | 0 | 23 | 0 | 42 | 0 | 47 | 0 | 35 | 4 |

F I G. 26C

| Column | 109 | | 110 | | 111 | | 112 | | 113 | | 114 | | 115 | | 116 | | 117 | | 118 | | 119 | | 120 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 11 | 0 | 10 | 2 | 16 | 2 | 6 | 2 | 2 | 5 | 20 | 5 | 1 | 0 | 2 | 0 | 5 | 6 | 19 | 6 | 9 | 0 | 4 | 5 |
| | 24 | 7 | 14 | 2 | 18 | 2 | 12 | 0 | 3 | 5 | 29 | 6 | 34 | 3 | 35 | 0 | 36 | 6 | 38 | 3 | 22 | 7 | 16 | 5 |
| | 46 | 7 | 20 | 0 | 31 | 0 | 43 | 6 | 34 | 0 | 42 | 0 | 48 | 1 | 40 | 3 | 39 | 0 | 45 | 0 | 24 | 3 | 21 | 0 |

| Column | 121 | | 122 | | 123 | | 124 | | 125 | | 126 | | 127 | | 128 | | 129 | | 130 | | 131 | | 132 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 17 | 5 | 1 | 6 | 11 | 1 | 6 | 0 | 18 | 7 | 4 | 0 | 6 | 4 | 5 | 0 | 8 | 0 | 3 | 1 | 4 | 6 | 7 | 1 |
| | 28 | 0 | 12 | 5 | 13 | 6 | 11 | 5 | 44 | 3 | 43 | 7 | 33 | 1 | 17 | 6 | 32 | 7 | 13 | 0 | 27 | 0 | 14 | 4 |
| | 32 | 0 | 15 | 0 | 22 | 0 | 40 | 0 | 45 | 0 | 45 | 2 | 35 | 0 | 47 | 7 | 34 | 1 | 37 | 7 | 41 | 7 | 32 | 0 |

| Column | 133 | | 134 | | 135 | | 136 | | 137 | | 138 | | 139 | | 140 | | 141 | | 142 | | 143 | | 144 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 28 | 2 | 15 | 6 | 6 | 2 | 2 | 2 | 10 | 5 | 9 | 0 | 10 | 0 | 22 | 6 | 31 | 7 | 25 | 0 | 12 | 0 | 18 | 3 |
| | 30 | 2 | 16 | 0 | 24 | 0 | 11 | 5 | 23 | 2 | 28 | 0 | 34 | 6 | 26 | 3 | 42 | 7 | 36 | 6 | 22 | 1 | 20 | 0 |
| | 40 | 0 | 47 | 6 | 37 | 1 | 30 | 0 | 32 | 0 | 33 | 3 | 43 | 6 | 30 | 0 | 45 | 0 | 48 | 0 | 46 | 0 | 39 | 4 |

FIG. 26D

| Column | 145 | | 146 | | 147 | | 148 | | 149 | | 150 | | 151 | | 152 | | 153 | | 154 | | 155 | | 156 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 15 | 1 | 3 | 5 | 1 | 3 | 25 | 3 | 18 | 0 | 6 | 3 | 5 | 0 | 39 | 2 | 15 | 4 | 2 | 0 | 1 | 4 | 7 | 1 |
| | 17 | 4 | 12 | 0 | 6 | 1 | 29 | 7 | 36 | 0 | 11 | 4 | 8 | 2 | 42 | 5 | 23 | 6 | 13 | 3 | 3 | 0 | 21 | 6 |
| | 25 | 0 | 48 | 0 | 32 | 0 | 38 | 0 | 41 | 6 | 28 | 0 | 25 | 0 | 47 | 0 | 31 | 0 | 28 | 3 | 33 | 0 | 44 | 0 |

| Column | 157 | | 158 | | 159 | | 160 | | 161 | | 162 | | 163 | | 164 | | 165 | | 166 | | 167 | | 168 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 5 | 0 | 8 | 0 | 15 | 0 | 4 | 7 | 1 | 0 | 2 | 4 | 25 | 6 | 10 | 0 | 15 | 0 | 7 | 0 | 12 | 5 | 9 | 4 |
| | 16 | 1 | 43 | 7 | 24 | 3 | 29 | 2 | 9 | 0 | 15 | 0 | 41 | 3 | 19 | 3 | 33 | 0 | 27 | 0 | 16 | 4 | 12 | 0 |
| | 20 | 5 | 48 | 4 | 40 | 0 | 44 | 0 | 16 | 0 | 22 | 0 | 46 | 0 | 42 | 0 | 37 | 0 | 31 | 1 | 17 | 0 | 35 | 5 |

| Column | 169 | | 170 | | 171 | | 172 | | 173 | | 174 | | 175 | | 176 | | 177 | | 178 | | 179 | | 180 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 13 | 2 | 11 | 1 | 23 | 7 | 18 | 0 | 3 | 3 | 24 | 0 | 29 | 0 | 25 | 0 | 5 | 0 | 14 | 0 | 6 | 5 | 20 | 2 |
| | 15 | 0 | 26 | 2 | 36 | 0 | 27 | 6 | 22 | 0 | 43 | 1 | 39 | 2 | 26 | 7 | 31 | 7 | 19 | 7 | 9 | 2 | 36 | 3 |
| | 30 | 3 | 30 | 0 | 38 | 0 | 29 | 7 | 25 | 1 | 47 | 6 | 41 | 0 | 28 | 0 | 44 | 2 | 34 | 2 | 17 | 0 | 46 | 0 |

FIG. 26E

| Column | 181 | | 182 | | 183 | | 184 | | 185 | | 186 | | 187 | | 188 | | 189 | | 190 | | 191 | | 192 | |
|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 8 | 0 | 11 | 2 | 10 | 0 | 13 | 6 | 14 | 2 | 6 | 1 | 4 | 0 | 20 | 3 | 1 | 0 | 5 | 0 | 13 | 7 | 1 | 0 |
| | 27 | 3 | 15 | 5 | 41 | 1 | 17 | 0 | 18 | 7 | 15 | 2 | 34 | 0 | 35 | 0 | 2 | 0 | 37 | 7 | 25 | 1 | 38 | 4 |
| | 42 | 7 | 26 | 0 | 45 | 6 | 41 | 4 | 21 | 0 | 28 | 0 | 39 | 7 | 48 | 0 | 41 | 0 | 38 | 2 | 32 | 0 | 46 | 6 |

| Column | 193 | | 194 | | 195 | | 196 | | 197 | | 198 | | 199 | | 200 | | 201 | | 202 | | 203 | | 204 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 22 | 0 | 23 | 2 | 4 | 6 | 15 | 5 | 33 | 2 | 21 | 4 | 3 | 0 | 11 | 1 | 3 | 5 | 7 | 0 | 22 | 1 | 12 | 0 |
| | 32 | 4 | 27 | 0 | 8 | 3 | 30 | 1 | 38 | 0 | 40 | 0 | 36 | 5 | 32 | 0 | 6 | 0 | 16 | 3 | 37 | 3 | 27 | 0 |
| | 33 | 7 | 43 | 1 | 31 | 0 | 32 | 0 | 43 | 0 | 42 | 3 | 44 | 7 | 37 | 0 | 41 | 3 | 19 | 0 | 44 | 0 | 39 | 0 |

| Column | 205 | | 206 | | 207 | | 208 | | 209 | | 210 | | 211 | | 212 | | 213 | | 214 | | 215 | | 216 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 20 | 0 | 5 | 2 | 44 | 2 | 17 | 1 | 20 | 1 | 14 | 0 | 26 | 2 | 21 | 0 | 4 | 0 | 21 | 4 | 25 | 5 | 11 | 0 |
| | 45 | 3 | 21 | 5 | 46 | 2 | 30 | 0 | 28 | 4 | 36 | 0 | 32 | 4 | 24 | 5 | 7 | 6 | 35 | 0 | 33 | 5 | 15 | 2 |
| | 47 | 0 | 23 | 0 | 48 | 0 | 38 | 0 | 37 | 0 | 45 | 1 | 44 | 0 | 34 | 0 | 10 | 0 | 45 | 5 | 44 | 0 | 44 | 0 |

FIG. 26F

| Column | 217 | | 218 | | 219 | | 220 | | 221 | | 222 | | 223 | | 224 | | 225 | | 226 | | 227 | | 228 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 9 | 0 | 5 | 1 | 3 | 0 | 1 | 4 | 14 | 1 | 30 | 5 | 7 | 0 | 12 | 0 | 13 | 2 | 10 | 0 | 14 | 0 | 11 | 3 |
| | 38 | 3 | 19 | 0 | 15 | 3 | 8 | 0 | 16 | 0 | 36 | 4 | 18 | 0 | 19 | 5 | 45 | 3 | 28 | 6 | 24 | 4 | 32 | 3 |
| | 47 | 3 | 40 | 0 | 20 | 6 | 18 | 1 | 29 | 0 | 37 | 0 | 48 | 1 | 23 | 0 | 48 | 0 | 36 | 1 | 27 | 0 | 36 | 0 |

...

| Column | 229 | | 230 | | 231 | | 232 | | 233 | | 234 | | 235 | | 236 | | 237 | | 238 | | 239 | | 240 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 10 | 0 | 5 | 0 | 19 | 0 | 3 | 1 | 16 | 3 | 9 | 1 | 2 | 0 | 4 | 3 | 7 | 3 | 17 | 1 | 4 | 0 | 12 | 6 |
| | 22 | 1 | 35 | 1 | 43 | 0 | 14 | 3 | 39 | 0 | 27 | 7 | 21 | 7 | 13 | 0 | 20 | 2 | 24 | 1 | 26 | 5 | 18 | 0 |
| | 47 | 0 | 41 | 3 | 46 | 5 | 38 | 0 | 40 | 1 | 48 | 0 | 29 | 1 | 47 | 4 | 25 | 0 | 31 | 0 | 36 | 0 | 33 | 0 |

...

| Column | 241 | | 242 | | 243 | | 244 | | 245 | | 246 | | 247 | | 248 | | 249 | | 250 | | 251 | | 252 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 0 | 3 | 4 | 17 | 4 | 34 | 6 | 4 | 5 | 4 | 0 | 6 | 1 | 18 | 0 | 14 | 4 | 16 | 1 | 10 | 4 | 7 | 0 |
| | 23 | 1 | 4 | 0 | 23 | 0 | 35 | 0 | 32 | 7 | 30 | 5 | 8 | 0 | 40 | 3 | 30 | 0 | 34 | 0 | 12 | 7 | 39 | 4 |
| | 42 | 0 | 26 | 4 | 45 | 4 | 42 | 3 | 37 | 0 | 36 | 6 | 19 | 0 | 43 | 2 | 44 | 7 | 46 | 0 | 38 | 0 | 43 | 6 |

| Column | 253 | | 254 | | 255 | | 256 | | 257 | | 258 | | 259 | | 260 | | 261 | | 262 | | 263 | | 264 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 10 | 0 | 18 | 5 | 12 | 0 | 12 | 1 | 4 | 0 | 1 | 6 | 3 | 5 | 9 | 1 | 28 | 1 | 9 | 0 | 8 | 1 | 2 | 0 |
| | 39 | 0 | 46 | 1 | 37 | 7 | 14 | 2 | 11 | 0 | 19 | 2 | 18 | 4 | 21 | 2 | 45 | 3 | 20 | 2 | 16 | 1 | 6 | 0 |
| | 48 | 5 | 47 | 0 | 45 | 4 | 26 | 0 | 38 | 1 | 24 | 0 | 32 | 0 | 41 | 0 | 46 | 0 | 31 | 0 | 33 | 0 | 42 | 1 |

| Column | 265 | | 266 | | 267 | | 268 | | 269 | | 270 | | 271 | | 272 | | 273 | | 274 | | 275 | | 276 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 15 | 6 | 22 | 5 | 22 | 0 | 10 | 0 | 13 | 6 | 7 | 0 | 7 | 0 | 12 | 0 | 1 | 2 | 10 | 6 | 33 | 4 | 2 | 5 |
| | 29 | 7 | 27 | 6 | 31 | 7 | 26 | 7 | 14 | 0 | 24 | 3 | 40 | 2 | 13 | 0 | 27 | 7 | 18 | 2 | 42 | 1 | 5 | 2 |
| | 34 | 0 | 40 | 0 | 41 | 0 | 38 | 3 | 43 | 0 | 42 | 0 | 47 | 4 | 44 | 3 | 28 | 0 | 30 | 0 | 48 | 0 | 27 | 0 |

| Column | 277 | | 278 | | 279 | | 280 | | 281 | | 282 | | 283 | | 284 | | 285 | | 286 | | 287 | | 288 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 16 | 5 | 4 | 0 | 3 | 2 | 17 | 0 | 8 | 1 | 37 | 2 | 2 | 0 | 6 | 1 | 11 | 2 | 14 | 2 | 1 | 0 | 26 | 3 |
| | 23 | 2 | 11 | 1 | 8 | 0 | 21 | 0 | 29 | 0 | 39 | 0 | 19 | 6 | 31 | 0 | 38 | 0 | 37 | 2 | 29 | 0 | 39 | 7 |
| | 35 | 0 | 12 | 4 | 39 | 4 | 33 | 0 | 47 | 2 | 43 | 0 | 25 | 0 | 38 | 6 | 45 | 7 | 42 | 0 | 35 | 0 | 42 | 0 |

FIG. 26I

| Column | 289 | | 290 | | 291 | | 292 | | 293 | | 294 | | 295 | | 296 | | 297 | | 298 | | 299 | | 300 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 9 | 4 | 23 | 0 | 23 | 3 | 13 | 2 | 7 | 1 | 29 | 3 | 11 | 5 | 10 | 4 | 4 | 0 | 24 | 1 | 33 | 1 | 8 | 0 |
| | 19 | 0 | 29 | 4 | 24 | 0 | 20 | 5 | 34 | 0 | 30 | 1 | 23 | 0 | 31 | 2 | 42 | 3 | 38 | 0 | 39 | 2 | 28 | 5 |
| | 36 | 2 | 40 | 5 | 44 | 7 | 27 | 0 | 41 | 0 | 43 | 0 | 47 | 5 | 35 | 0 | 45 | 7 | 48 | 3 | 45 | 0 | 44 | 7 |

| Column | 301 | | 302 | | 303 | | 304 | | 305 | | 306 | | 307 | | 308 | | 309 | | 310 | | 311 | | 312 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 11 | 0 | 26 | 0 | 13 | 3 | 25 | 4 | 5 | 0 | 6 | 0 | 2 | 6 | 17 | 4 | 1 | 0 | 5 | 2 | 15 | 0 | 8 | 2 |
| | 33 | 5 | 43 | 6 | 14 | 4 | 31 | 1 | 32 | 2 | 21 | 2 | 16 | 0 | 29 | 5 | 7 | 3 | 6 | 0 | 19 | 0 | 20 | 0 |
| | 39 | 4 | 48 | 0 | 39 | 0 | 40 | 0 | 46 | 7 | 25 | 4 | 32 | 0 | 36 | 0 | 45 | 6 | 18 | 1 | 48 | 3 | 22 | 0 |

| Column | 313 | | 314 | | 315 | | 316 | | 317 | | 318 | | 319 | | 320 | | 321 | | 322 | | 323 | | 324 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 9 | 7 | 31 | 1 | 13 | 3 | 1 | 2 | 1 | 2 | 14 | 0 | 3 | 7 | 5 | 3 | 13 | 2 | 5 | 3 | 6 | 5 | 3 | 0 |
| | 25 | 3 | 37 | 0 | 37 | 1 | 4 | 0 | 10 | 0 | 31 | 2 | 17 | 5 | 28 | 0 | 26 | 4 | 12 | 4 | 27 | 6 | 19 | 3 |
| | 34 | 0 | 47 | 4 | 42 | 0 | 24 | 3 | 44 | 7 | 33 | 7 | 27 | 0 | 43 | 3 | 31 | 0 | 34 | 0 | 46 | 0 | 35 | 6 |

| Column | 325 | | 326 | | 327 | | 328 | | 329 | | 330 | | 331 | | 332 | | 333 | | 334 | | 335 | | 336 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 8 | 0 | 2 | 3 | 34 | 5 | 1 | 0 | 17 | 0 | 21 | 0 | 17 | 2 | 13 | 4 | 7 | 6 | 26 | 1 | 4 | 0 | 1 | 7 |
| | 30 | 2 | 10 | 1 | 38 | 0 | 23 | 6 | 42 | 4 | 30 | 1 | 26 | 0 | 31 | 0 | 9 | 1 | 33 | 3 | 22 | 4 | 11 | 1 |
| | 41 | 0 | 24 | 0 | 40 | 0 | 26 | 6 | 44 | 4 | 48 | 1 | 34 | 0 | 47 | 2 | 39 | 0 | 47 | 0 | 35 | 6 | 20 | 0 |

| Column | 337 | | 338 | | 339 | | 340 | | 341 | | 342 | | 343 | | 344 | | 345 | | 346 | | 347 | | 348 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 27 | 1 | 20 | 7 | 2 | 2 | 8 | 5 | 4 | 0 | 22 | 1 | 2 | 1 | 2 | 0 | 2 | 3 | 10 | 2 | 9 | 0 | 0 | 0 |
| | 35 | 1 | 24 | 4 | 9 | 0 | 35 | 3 | 9 | 3 | 23 | 2 | 14 | 1 | 12 | 0 | 4 | 0 | 16 | 5 | 22 | 0 | 21 | 0 |
| | 37 | 0 | 41 | 0 | 45 | 1 | 36 | 0 | 14 | 0 | 41 | 0 | 47 | 0 | 20 | 5 | 39 | 3 | 25 | 0 | 42 | 6 | 43 | 5 |

| Column | 349 | | 350 | | 351 | | 352 | | 353 | | 354 | | 355 | | 356 | | 357 | | 358 | | 359 | | 360 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 4 | 7 | 32 | 0 | 5 | 7 | 15 | 0 | 12 | 0 | 9 | 3 | 7 | 0 | 17 | 1 | 11 | 0 | 8 | 0 | 3 | 4 | 14 | 3 |
| | 31 | 4 | 40 | 0 | 7 | 0 | 39 | 0 | 40 | 6 | 29 | 0 | 37 | 3 | 18 | 3 | 16 | 2 | 15 | 0 | 21 | 0 | 22 | 0 |
| | 33 | 0 | 45 | 0 | 15 | 1 | 46 | 0 | 41 | 1 | 32 | 0 | 41 | 0 | 19 | 0 | 48 | 0 | 45 | 1 | 46 | 5 | 45 | 0 |

F I G. 26J

| Column | 361 | | 362 | | 363 | | 364 | | 365 | | 366 | ... | 367 | | 368 | | 369 | | 370 | | 371 | | 372 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 22 | 6 | 13 | 7 | 2 | 0 | 14 | 0 | 13 | 6 | 16 | 7 | 17 | 5 | 4 | 0 | 6 | 0 | 18 | 6 | 5 | 0 | 23 | 0 |
| | 24 | 0 | 33 | 4 | 18 | 3 | 26 | 4 | 19 | 2 | 19 | 1 | 33 | 7 | 23 | 1 | 10 | 0 | 21 | 0 | 27 | 3 | 25 | 4 |
| | 39 | 2 | 34 | 0 | 44 | 0 | 31 | 7 | 21 | 0 | 28 | 0 | 34 | 0 | 46 | 6 | 36 | 4 | 37 | 0 | 30 | 0 | 43 | 0 |

| Column | 373 | | 374 | | 375 | | 376 | | 377 | | 378 | ... | 379 | | 380 | | 381 | | 382 | | 383 | | 384 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 21 | 0 | 18 | 0 | 14 | 0 | 3 | 0 | 4 | 0 | 9 | 6 | 35 | 0 | 17 | 0 | 19 | 0 | 1 | 0 | 20 | 0 | 8 | 0 |
| | 28 | 0 | 24 | 0 | 25 | 1 | 16 | 0 | 13 | 0 | 31 | 1 | 43 | 0 | 31 | 0 | 26 | 0 | 7 | 0 | 27 | 0 | 12 | 0 |
| | 38 | 0 | 25 | 0 | 42 | 0 | 40 | 0 | 17 | 0 | 34 | 0 | 47 | 0 | 39 | 0 | 27 | 0 | 36 | 0 | 33 | 0 | 21 | 0 |

| Column | 385 | | 386 | | 387 | | 388 | | 389 | | 390 | ... | 391 | | 392 | |
|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift |
| Data | 34 | 0 | 20 | 0 | 9 | 0 | 22 | 0 | 22 | 0 | 19 | 0 | 40 | 0 | 5 | 0 |
| | 42 | 0 | 36 | 0 | 17 | 0 | 29 | 0 | 25 | 0 | 29 | 0 | 44 | 0 | 10 | 0 |
| | 47 | 0 | 40 | 0 | 47 | 0 | 46 | 0 | 34 | 0 | 37 | 0 | 48 | 0 | 29 | 0 |

FIG. 26K

| Column | 1 | | 2 | | 3 | | 4 | | 5 | | 6 | | 7 | | 8 | | 9 | | 10 | | 11 | | 12 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 8 | 6 | 6 | 7 | 19 | 0 | 15 | 0 | 18 | 0 | 23 | 0 | 25 | 0 | 38 | 0 | 27 | 2 | 10 | 0 | 14 | 0 | 0 | 0 |
| | 13 | 0 | 14 | 0 | 33 | 3 | 20 | 3 | 37 | 1 | 38 | 4 | 31 | 0 | 44 | 0 | 33 | 3 | 18 | 7 | 32 | 1 | 7 | 0 |
| | 40 | 1 | 34 | 5 | 41 | 0 | 44 | 1 | 39 | 4 | 39 | 6 | 39 | 4 | 48 | 2 | 46 | 0 | 47 | 3 | 34 | 0 | 35 | 4 |

| Column | 13 | | 14 | | 15 | | 16 | | 17 | | 18 | | 19 | | 20 | | 21 | | 22 | | 23 | | 24 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 25 | 0 | 4 | 0 | 6 | 3 | 24 | 5 | 1 | 0 | 3 | 1 | 20 | 6 | 15 | 7 | 10 | 0 | 19 | 1 | 2 | 0 | 9 | 0 |
| | 37 | 2 | 12 | 2 | 9 | 4 | 36 | 7 | 21 | 3 | 8 | 4 | 23 | 7 | 23 | 5 | 35 | 7 | 26 | 2 | 12 | 0 | 32 | 2 |
| | 47 | 0 | 17 | 1 | 12 | 0 | 40 | 0 | 45 | 6 | 15 | 0 | 37 | 0 | 48 | 0 | 43 | 7 | 28 | 0 | 46 | 6 | 42 | 4 |

| Column | 25 | | 26 | | 27 | | 28 | | 29 | | 30 | | 31 | | 32 | | 33 | | 34 | | 35 | | 36 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 17 | 2 | 5 | 7 | 32 | 7 | 8 | 3 | 16 | 2 | 29 | 4 | 7 | 0 | 11 | 7 | 1 | 2 | 2 | 5 | 18 | 2 | 26 | 3 |
| | 28 | 0 | 10 | 0 | 34 | 3 | 24 | 0 | 36 | 7 | 35 | 4 | 29 | 1 | 21 | 0 | 5 | 0 | 4 | 4 | 31 | 0 | 40 | 1 |
| | 46 | 0 | 45 | 7 | 42 | 0 | 48 | 2 | 41 | 0 | 45 | 0 | 30 | 7 | 29 | 0 | 43 | 0 | 27 | 0 | 43 | 2 | 41 | 0 |

FIG. 27A

| Column | 37 | | 38 | | 39 | | 40 | | 41 | | 42 | | 43 | | 44 | | 45 | | 46 | | 47 | | 48 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 16 | 0 | 7 | 2 | 4 | 0 | 2 | 6 | 20 | 5 | 3 | 0 | 17 | 0 | 3 | 6 | 13 | 6 | 5 | 0 | 8 | 1 | 4 | 1 |
| | 28 | 3 | 21 | 7 | 9 | 4 | 6 | 0 | 25 | 0 | 24 | 4 | 19 | 4 | 13 | 0 | 16 | 4 | 31 | 7 | 14 | 1 | 6 | 0 |
| | 33 | 7 | 22 | 0 | 42 | 2 | 42 | 0 | 38 | 0 | 44 | 1 | 27 | 0 | 36 | 3 | 26 | 0 | 47 | 1 | 28 | 0 | 32 | 0 |

...

| Column | 49 | | 50 | | 51 | | 52 | | 53 | | 54 | | 55 | | 56 | | 57 | | 58 | | 59 | | 60 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 0 | 9 | 0 | 3 | 7 | 26 | 3 | 13 | 0 | 12 | 2 | 27 | 2 | 25 | 2 | 8 | 6 | 7 | 4 | 37 | 4 | 2 | 3 |
| | 34 | 6 | 20 | 7 | 18 | 6 | 33 | 1 | 31 | 4 | 14 | 0 | 34 | 0 | 35 | 0 | 16 | 4 | 40 | 0 | 44 | 0 | 9 | 4 |
| | 41 | 4 | 24 | 2 | 19 | 0 | 39 | 0 | 46 | 6 | 38 | 5 | 36 | 6 | 48 | 0 | 17 | 0 | 47 | 4 | 45 | 0 | 17 | 0 |

...

| Column | 61 | | 62 | | 63 | | 64 | | 65 | | 66 | | 67 | | 68 | | 69 | | 70 | | 71 | | 72 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 26 | 4 | 24 | 0 | 10 | 7 | 43 | 0 | 5 | 1 | 1 | 0 | 5 | 0 | 6 | 0 | 13 | 0 | 6 | 5 | 4 | 0 | 1 | 7 |
| | 27 | 5 | 32 | 4 | 11 | 4 | 45 | 5 | 11 | 1 | 11 | 1 | 25 | 1 | 41 | 7 | 14 | 0 | 27 | 3 | 36 | 7 | 10 | 0 |
| | 42 | 0 | 33 | 0 | 23 | 0 | 48 | 0 | 16 | 0 | 15 | 4 | 29 | 2 | 46 | 0 | 35 | 7 | 32 | 0 | 39 | 6 | 40 | 3 |

| Column | 73 | | 74 | | 75 | | 76 | | 77 | | 78 | | 79 | | 80 | | 81 | | 82 | | 83 | | 84 | |
|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 7 | 3 | 7 | 28 | 6 | 19 | 4 | 18 | 0 | 12 | 4 | 7 | 5 | 6 | 1 | 4 | 0 | 9 | 0 | 13 | 0 | 21 | 0 |
| | 32 | 7 | 31 | 1 | 39 | 0 | 20 | 0 | 22 | 0 | 22 | 0 | 23 | 0 | 36 | 4 | 38 | 5 | 16 | 6 | 28 | 5 | 30 | 7 |
| | 36 | 0 | 37 | 0 | 42 | 0 | 47 | 0 | 30 | 2 | 29 | 1 | 43 | 4 | 42 | 0 | 40 | 6 | 38 | 7 | 34 | 3 | 44 | 2 |

...

| Column | 85 | | 86 | | 87 | | 88 | | 89 | | 90 | | 91 | | 92 | | 93 | | 94 | | 95 | | 96 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 17 | 3 | 4 | 2 | 3 | 6 | 37 | 3 | 8 | 1 | 3 | 4 | 14 | 3 | 5 | 1 | 16 | 7 | 2 | 4 | 27 | 6 | 3 | 0 |
| | 24 | 7 | 6 | 0 | 33 | 0 | 43 | 7 | 11 | 0 | 11 | 2 | 31 | 0 | 7 | 0 | 24 | 0 | 36 | 7 | 28 | 2 | 34 | 4 |
| | 26 | 0 | 39 | 5 | 48 | 5 | 46 | 0 | 31 | 5 | 20 | 0 | 41 | 0 | 33 | 4 | 46 | 0 | 39 | 0 | 41 | 0 | 35 | 0 |

...

| Column | 97 | | 98 | | 99 | | 100 | | 101 | | 102 | | 103 | | 104 | | 105 | | 106 | | 107 | | 108 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 10 | 7 | 9 | 0 | 14 | 5 | 19 | 0 | 9 | 2 | 23 | 7 | 5 | 1 | 30 | 7 | 20 | 3 | 2 | 0 | 4 | 2 | 7 | 2 |
| | 25 | 2 | 26 | 6 | 17 | 0 | 22 | 0 | 27 | 0 | 30 | 0 | 35 | 6 | 38 | 0 | 21 | 3 | 28 | 5 | 13 | 0 | 14 | 0 |
| | 30 | 0 | 34 | 4 | 42 | 2 | 45 | 0 | 39 | 0 | 47 | 1 | 37 | 0 | 43 | 4 | 40 | 0 | 35 | 3 | 41 | 1 | 24 | 2 |

| Column | 109 | | 110 | | 111 | | 112 | | 113 | | 114 | | 115 | | 116 | | 117 | | 118 | | 119 | | 120 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 15 | 0 | 1 | 2 | 1 | 0 | 15 | 5 | 12 | 0 | 13 | 0 | 17 | 7 | 35 | 0 | 32 | 6 | 11 | 6 | 6 | 3 | 7 | 2 |
| | 17 | 5 | 22 | 1 | 26 | 1 | 16 | 0 | 47 | 2 | 21 | 0 | 32 | 0 | 41 | 5 | 35 | 2 | 25 | 0 | 28 | 6 | 15 | 7 |
| | 31 | 0 | 44 | 0 | 37 | 4 | 21 | 0 | 48 | 3 | 32 | 5 | 41 | 0 | 42 | 3 | 39 | 0 | 44 | 7 | 36 | 0 | 37 | 0 |

| Column | 121 | | 122 | | 123 | | 124 | | 125 | | 126 | | 127 | | 128 | | 129 | | 130 | | 131 | | 132 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 4 | 0 | 11 | 6 | 8 | 2 | 23 | 5 | 1 | 0 | 2 | 3 | 5 | 3 | 3 | 0 | 21 | 0 | 22 | 0 | 7 | 4 | 2 | 5 |
| | 28 | 2 | 19 | 0 | 18 | 4 | 29 | 1 | 29 | 6 | 6 | 7 | 15 | 5 | 21 | 5 | 24 | 0 | 33 | 4 | 26 | 2 | 4 | 0 |
| | 36 | 3 | 30 | 6 | 23 | 0 | 46 | 0 | 38 | 2 | 13 | 0 | 19 | 0 | 38 | 5 | 27 | 1 | 43 | 4 | 31 | 0 | 35 | 7 |

| Column | 133 | | 134 | | 135 | | 136 | | 137 | | 138 | | 139 | | 140 | | 141 | | 142 | | 143 | | 144 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 12 | 0 | 14 | 7 | 18 | 0 | 22 | 0 | 9 | 3 | 5 | 0 | 7 | 7 | 21 | 0 | 6 | 2 | 15 | 4 | 8 | 5 | 14 | 0 |
| | 30 | 0 | 16 | 0 | 29 | 3 | 34 | 7 | 21 | 6 | 22 | 7 | 20 | 0 | 35 | 5 | 24 | 4 | 29 | 1 | 10 | 0 | 20 | 7 |
| | 45 | 2 | 43 | 1 | 44 | 6 | 40 | 2 | 31 | 0 | 46 | 2 | 27 | 1 | 36 | 6 | 35 | 0 | 40 | 0 | 12 | 0 | 22 | 6 |

FIG. 27D

| Column | 145 | | 146 | | 147 | | 148 | | 149 | | 150 | | 151 | | 152 | | 153 | | 154 | | 155 | | 156 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 13 | 4 | 1 | 3 | 13 | 6 | 10 | 0 | 16 | 6 | 18 | 2 | 26 | 5 | 4 | 1 | 2 | 0 | 9 | 2 | 16 | 7 | 8 | 6 |
| | 17 | 0 | 18 | 0 | 15 | 7 | 33 | 4 | 22 | 0 | 25 | 2 | 29 | 6 | 21 | 0 | 24 | 0 | 14 | 0 | 31 | 7 | 9 | 6 |
| | 20 | 1 | 48 | 2 | 42 | 0 | 44 | 1 | 23 | 0 | 40 | 0 | 43 | 0 | 28 | 0 | 42 | 0 | 15 | 0 | 32 | 0 | 37 | 0 |

...

| Column | 157 | | 158 | | 159 | | 160 | | 161 | | 162 | | 163 | | 164 | | 165 | | 166 | | 167 | | 168 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 1 | 0 | 4 | 0 | 11 | 0 | 20 | 0 | 13 | 6 | 10 | 0 | 12 | 1 | 34 | 3 | 6 | 0 | 17 | 0 | 2 | 2 | 8 | 3 |
| | 25 | 1 | 24 | 7 | 45 | 1 | 28 | 2 | 23 | 0 | 41 | 3 | 19 | 7 | 45 | 7 | 21 | 3 | 43 | 6 | 4 | 4 | 38 | 6 |
| | 33 | 7 | 31 | 3 | 47 | 1 | 31 | 1 | 27 | 0 | 48 | 6 | 39 | 0 | 46 | 0 | 28 | 0 | 44 | 3 | 21 | 0 | 47 | 0 |

...

| Column | 169 | | 170 | | 171 | | 172 | | 173 | | 174 | | 175 | | 176 | | 177 | | 178 | | 179 | | 180 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 5 | 0 | 7 | 0 | 3 | 3 | 15 | 0 | 8 | 2 | 1 | 6 | 15 | 4 | 23 | 2 | 17 | 0 | 6 | 5 | 30 | 2 | 10 | 0 |
| | 12 | 4 | 19 | 3 | 10 | 0 | 27 | 0 | 29 | 1 | 3 | 0 | 24 | 6 | 33 | 1 | 22 | 5 | 20 | 0 | 46 | 1 | 37 | 2 |
| | 18 | 4 | 44 | 0 | 26 | 3 | 35 | 5 | 33 | 0 | 47 | 5 | 28 | 0 | 36 | 0 | 37 | 3 | 31 | 0 | 48 | 0 | 42 | 0 |

FIG. 27E

| Column | 181 | | 182 | | 183 | | 184 | | 185 | | 186 | | 187 | | 188 | | 189 | | 190 | | 191 | | 192 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 7 | 5 | 11 | 6 | 2 | 0 | 5 | 0 | 14 | 2 | 1 | 0 | 4 | 0 | 5 | 0 | 7 | 5 | 13 | 2 | 6 | 6 | 11 | 0 |
| | 12 | 1 | 40 | 0 | 15 | 0 | 30 | 1 | 23 | 1 | 23 | 6 | 16 | 0 | 32 | 0 | 9 | 6 | 22 | 7 | 10 | 0 | 18 | 4 |
| | 25 | 0 | 48 | 0 | 22 | 1 | 39 | 5 | 25 | 0 | 42 | 3 | 20 | 0 | 44 | 7 | 10 | 0 | 25 | 0 | 16 | 2 | 26 | 6 |

| Column | 193 | | 194 | | 195 | | 196 | | 197 | | 198 | | 199 | | 200 | | 201 | | 202 | | 203 | | 204 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 6 | 19 | 0 | 10 | 1 | 8 | 0 | 3 | 0 | 20 | 5 | 16 | 0 | 9 | 4 | 6 | 0 | 5 | 5 | 1 | 0 | 10 | 6 |
| | 14 | 0 | 25 | 3 | 19 | 6 | 30 | 1 | 12 | 0 | 28 | 1 | 19 | 2 | 13 | 3 | 10 | 0 | 36 | 2 | 39 | 2 | 15 | 6 |
| | 37 | 3 | 32 | 2 | 24 | 0 | 41 | 0 | 43 | 3 | 32 | 0 | 37 | 1 | 19 | 0 | 31 | 0 | 48 | 0 | 46 | 2 | 32 | 0 |

| Column | 205 | | 206 | | 207 | | 208 | | 209 | | 210 | | 211 | | 212 | | 213 | | 214 | | 215 | | 216 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 17 | 1 | 10 | 0 | 27 | 0 | 26 | 4 | 9 | 0 | 11 | 0 | 4 | 3 | 14 | 4 | 21 | 1 | 3 | 0 | 7 | 1 | 5 | 7 |
| | 18 | 5 | 20 | 0 | 43 | 0 | 38 | 5 | 25 | 4 | 34 | 1 | 10 | 4 | 44 | 0 | 34 | 5 | 41 | 1 | 18 | 0 | 17 | 1 |
| | 45 | 0 | 32 | 4 | 47 | 0 | 45 | 0 | 46 | 0 | 38 | 3 | 22 | 0 | 47 | 7 | 47 | 0 | 45 | 3 | 42 | 2 | 23 | 0 |

FIG. 27F

| Column | 217 | | 218 | | 219 | | 220 | | 221 | | 222 | | 223 | | 224 | | 225 | | 226 | | 227 | | 228 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 5 | 30 | 0 | 29 | 7 | 8 | 0 | 4 | 5 | 11 | 6 | 42 | 7 | 22 | 2 | 23 | 5 | 13 | 0 | 1 | 1 | 8 | 3 |
| | 26 | 0 | 35 | 7 | 34 | 0 | 39 | 7 | 15 | 7 | 12 | 3 | 44 | 1 | 28 | 4 | 40 | 5 | 24 | 5 | 12 | 0 | 36 | 0 |
| | 30 | 4 | 40 | 1 | 48 | 0 | 45 | 3 | 25 | 0 | 33 | 0 | 46 | 0 | 32 | 0 | 45 | 0 | 47 | 0 | 41 | 1 | 44 | 0 |

...

| Column | 229 | | 230 | | 231 | | 232 | | 233 | | 234 | | 235 | | 236 | | 237 | | 238 | | 239 | | 240 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 4 | 0 | 7 | 0 | 9 | 0 | 17 | 0 | 11 | 2 | 11 | 2 | 9 | 3 | 15 | 7 | 6 | 7 | 1 | 0 | 5 | 0 | 10 | 3 |
| | 14 | 4 | 11 | 4 | 23 | 4 | 39 | 4 | 24 | 5 | 22 | 6 | 11 | 0 | 20 | 0 | 18 | 5 | 16 | 2 | 8 | 1 | 14 | 5 |
| | 19 | 6 | 46 | 5 | 44 | 4 | 47 | 5 | 37 | 0 | 39 | 0 | 28 | 0 | 46 | 6 | 38 | 0 | 30 | 0 | 34 | 0 | 46 | 0 |

...

| Column | 241 | | 242 | | 243 | | 244 | | 245 | | 246 | | 247 | | 248 | | 249 | | 250 | | 251 | | 252 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 9 | 0 | 3 | 7 | 3 | 0 | 4 | 0 | 13 | 6 | 3 | 2 | 29 | 3 | 19 | 3 | 20 | 7 | 14 | 7 | 7 | 0 | 19 | 3 |
| | 22 | 6 | 16 | 0 | 27 | 3 | 32 | 5 | 18 | 0 | 25 | 0 | 31 | 7 | 40 | 1 | 33 | 4 | 19 | 5 | 39 | 4 | 22 | 0 |
| | 47 | 3 | 40 | 0 | 29 | 5 | 46 | 4 | 33 | 1 | 42 | 2 | 36 | 0 | 43 | 0 | 45 | 0 | 46 | 0 | 41 | 2 | 42 | 1 |

| Column | 253 | | 254 | | 255 | | 256 | | 257 | | 258 | | 259 | | 260 | | 261 | | 262 | | 263 | | 264 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 12 | 1 | 2 | 7 | 25 | 3 | 17 | 0 | 4 | 0 | 32 | 0 | 8 | 0 | 11 | 0 | 24 | 0 | 33 | 5 | 12 | 1 | 33 | 4 |
| | 27 | 2 | 5 | 0 | 28 | 0 | 36 | 1 | 44 | 5 | 46 | 4 | 21 | 1 | 42 | 7 | 41 | 1 | 34 | 0 | 26 | 4 | 35 | 7 |
| | 40 | 0 | 38 | 0 | 44 | 0 | 38 | 0 | 47 | 2 | 47 | 0 | 43 | 4 | 43 | 7 | 43 | 1 | 37 | 1 | 36 | 0 | 38 | 0 |

| Column | 265 | | 266 | | 267 | | 268 | | 269 | | 270 | | 271 | | 272 | | 273 | | 274 | | 275 | | 276 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 21 | 1 | 7 | 0 | 14 | 0 | 16 | 3 | 4 | 5 | 23 | 7 | 27 | 5 | 12 | 0 | 3 | 6 | 1 | 0 | 4 | 0 | 9 | 0 |
| | 26 | 2 | 36 | 4 | 29 | 5 | 18 | 0 | 19 | 1 | 29 | 2 | 37 | 5 | 16 | 0 | 17 | 0 | 6 | 0 | 29 | 4 | 29 | 2 |
| | 48 | 0 | 45 | 5 | 39 | 6 | 27 | 3 | 23 | 0 | 32 | 0 | 38 | 0 | 34 | 5 | 30 | 0 | 8 | 4 | 47 | 1 | 41 | 7 |

| Column | 277 | | 278 | | 279 | | 280 | | 281 | | 282 | | 283 | | 284 | | 285 | | 286 | | 287 | | 288 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 23 | 0 | 28 | 7 | 32 | 2 | 25 | 0 | 16 | 2 | 15 | 1 | 6 | 0 | 2 | 5 | 1 | 0 | 10 | 2 | 3 | 5 | 2 | 0 |
| | 41 | 5 | 30 | 3 | 37 | 6 | 41 | 4 | 29 | 0 | 18 | 5 | 30 | 6 | 3 | 3 | 17 | 3 | 13 | 0 | 9 | 5 | 40 | 2 |
| | 44 | 1 | 37 | 0 | 40 | 0 | 47 | 1 | 42 | 7 | 34 | 0 | 33 | 5 | 7 | 0 | 34 | 5 | 38 | 4 | 14 | 0 | 44 | 0 |

FIG. 27H

| Column | 289 | | 290 | | 291 | | 292 | | 293 | | 294 | | 295 | | 296 | | 297 | | 298 | | 299 | | 300 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 12 | 4 | 19 | 3 | 13 | 4 | 25 | 1 | 27 | 5 | 14 | 0 | 20 | 0 | 3 | 2 | 12 | 4 | 22 | 4 | 5 | 7 | 9 | 0 |
| | 23 | 6 | 29 | 0 | 39 | 0 | 34 | 5 | 31 | 2 | 33 | 1 | 26 | 5 | 4 | 2 | 37 | 3 | 31 | 7 | 6 | 0 | 30 | 3 |
| | 28 | 0 | 47 | 3 | 43 | 0 | 43 | 0 | 45 | 0 | 40 | 5 | 35 | 4 | 23 | 0 | 41 | 0 | 48 | 0 | 40 | 3 | 36 | 1 |

| Column | 301 | | 302 | | 303 | | 304 | | 305 | | 306 | | 307 | | 308 | | 309 | | 310 | | 311 | | 312 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 2 | 1 | 11 | 5 | 2 | 0 | 18 | 2 | 7 | 1 | 14 | 7 | 22 | 6 | 34 | 3 | 5 | 0 | 1 | 7 | 8 | 2 | 2 | 0 |
| | 19 | 6 | 17 | 3 | 25 | 6 | 21 | 6 | 13 | 0 | 27 | 0 | 24 | 3 | 39 | 1 | 21 | 3 | 20 | 0 | 22 | 5 | 16 | 5 |
| | 25 | 0 | 35 | 0 | 29 | 0 | 46 | 0 | 48 | 4 | 48 | 7 | 38 | 0 | 44 | 0 | 42 | 4 | 36 | 7 | 35 | 0 | 45 | 3 |

| Column | 313 | | 314 | | 315 | | 316 | | 317 | | 318 | | 319 | | 320 | | 321 | | 322 | | 323 | | 324 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 4 | 4 | 6 | 3 | 2 | 0 | 12 | 3 | 24 | 7 | 16 | 0 | 20 | 0 | 5 | 6 | 3 | 0 | 9 | 3 | 3 | 0 | 6 | 0 |
| | 7 | 0 | 15 | 0 | 23 | 0 | 13 | 0 | 30 | 0 | 39 | 2 | 42 | 7 | 14 | 2 | 7 | 0 | 40 | 0 | 39 | 5 | 37 | 0 |
| | 34 | 6 | 45 | 0 | 47 | 6 | 44 | 0 | 34 | 0 | 48 | 5 | 48 | 0 | 26 | 0 | 25 | 0 | 43 | 0 | 41 | 2 | 48 | 1 |

| Column | 325 | | 326 | | 327 | | 328 | | 329 | | 330 | | 331 | | 332 | | 333 | | 334 | | 335 | | 336 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 8 | 0 | 7 | 1 | 5 | 6 | 9 | 7 | 13 | 6 | 3 | 0 | 17 | 0 | 10 | 0 | 23 | 0 | 12 | 3 | 7 | 4 | 2 | 1 |
| | 26 | 3 | 19 | 0 | 20 | 0 | 18 | 4 | 30 | 3 | 19 | 5 | 21 | 2 | 17 | 0 | 31 | 4 | 31 | 0 | 28 | 3 | 7 | 3 |
| | 32 | 3 | 41 | 1 | 41 | 3 | 35 | 0 | 45 | 0 | 29 | 3 | 33 | 0 | 29 | 1 | 34 | 2 | 42 | 1 | 38 | 0 | 43 | 0 |

| Column | 337 | | 338 | | 339 | | 340 | | 341 | | 342 | | 343 | | 344 | | 345 | | 346 | | 347 | | 348 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 16 | 4 | 4 | 0 | 6 | 2 | 15 | 5 | 31 | 6 | 19 | 4 | 13 | 3 | 15 | 7 | 1 | 0 | 2 | 0 | 7 | 0 | 11 | 2 |
| | 25 | 2 | 43 | 2 | 22 | 5 | 33 | 0 | 35 | 1 | 31 | 0 | 29 | 4 | 38 | 1 | 2 | 0 | 18 | 3 | 16 | 0 | 14 | 1 |
| | 45 | 0 | 45 | 4 | 26 | 0 | 47 | 1 | 44 | 0 | 48 | 3 | 37 | 0 | 41 | 0 | 31 | 3 | 20 | 4 | 45 | 3 | 36 | 0 |

| Column | 349 | | 350 | | 351 | | 352 | | 353 | | 354 | | 355 | | 356 | | 357 | | 358 | | 359 | | 360 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 4 | 0 | 8 | 0 | 24 | 0 | 8 | 1 | 1 | 0 | 3 | 2 | 6 | 0 | 15 | 0 | 11 | 7 | 2 | 0 | 4 | 2 | 1 | 0 |
| | 43 | 4 | 26 | 4 | 39 | 2 | 25 | 0 | 24 | 5 | 5 | 0 | 17 | 7 | 36 | 7 | 27 | 4 | 45 | 0 | 5 | 3 | 14 | 0 |
| | 48 | 0 | 46 | 2 | 45 | 7 | 27 | 0 | 27 | 5 | 24 | 0 | 25 | 0 | 43 | 1 | 30 | 0 | 48 | 0 | 30 | 0 | 18 | 1 |

| Column | 361 | | 362 | | 363 | | 364 | | 365 | | 366 | | 367 | | 368 | | 369 | | 370 | | 371 | | 372 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 10 | 0 | 12 | 0 | 21 | 0 | 16 | 6 | 8 | 0 | 1 | 1 | 5 | 6 | 33 | 7 | 24 | 0 | 6 | 0 | 5 | 1 | 1 | 0 |
| | 21 | 4 | 32 | 5 | 23 | 0 | 24 | 0 | 12 | 5 | 11 | 0 | 16 | 0 | 40 | 2 | 30 | 0 | 11 | 0 | 22 | 7 | 19 | 0 |
| | 39 | 0 | 35 | 2 | 26 | 0 | 48 | 0 | 20 | 0 | 32 | 3 | 43 | 0 | 42 | 0 | 31 | 0 | 13 | 0 | 27 | 0 | 36 | 2 |

| Column | 373 | | 374 | | 375 | | 376 | | 377 | | 378 | | 379 | | 380 | | 381 | | 382 | | 383 | | 384 | |
|---|---|---|---|---|---|---|---|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift | Row | Shift | Row | Shift | Row | Shift | Row | Shift |
| Data | 10 | 6 | 1 | 0 | 10 | 0 | 15 | 0 | 26 | 0 | 12 | 0 | 19 | 0 | 17 | 0 | 18 | 0 | 3 | 0 | 22 | 0 | 3 | 0 |
| | 18 | 7 | 9 | 0 | 27 | 0 | 26 | 7 | 28 | 0 | 21 | 0 | 34 | 0 | 40 | 0 | 32 | 6 | 5 | 0 | 36 | 0 | 22 | 0 |
| | 28 | 0 | 33 | 0 | 36 | 0 | 30 | 0 | 47 | 0 | 37 | 0 | 38 | 0 | 46 | 3 | 38 | 0 | 48 | 1 | 46 | 0 | 30 | 0 |

| Column | 385 | | 386 | | 387 | | 388 | | 389 | | 390 | | 391 | | 392 | |
|---|---|---|---|---|---|---|---|---|---|---|---|---|---|---|---|---|
| | Row | Shift | Row | Shift | Row | Shift | Row | Shift | Row | Shift | Row | Shift | Row | Shift | Row | Shift |
| Data | 7 | 0 | 8 | 0 | 16 | 0 | 4 | 0 | 28 | 0 | 18 | 0 | 7 | 0 | 35 | 0 |
| | 8 | 0 | 38 | 0 | 35 | 0 | 11 | 0 | 29 | 0 | 21 | 0 | 32 | 0 | 38 | 0 |
| | 17 | 0 | 42 | 0 | 44 | 0 | 15 | 0 | 40 | 0 | 41 | 0 | 48 | 0 | 46 | 0 |

FIG. 27K

|  | Burst correction length | Maximum number of iterated decoding processes | Minimum guaranteed performance |
|---|---|---|---|
| H2 | 289 | 5 | 289 |
| H3 | 290 | 4 | 289 |
| H4 | 337 | 11 | 337 |
| H5 | 337 | 8 | 337 |
| H6 | 361 | 23 | 361 |
| H7 | 361 | 16 | 361 |

FIG. 28

Mask matrix (12Rows98Columns)

| H2 | 517 |
|---|---|
| H3 | 518 |
| Comparative example | 1857 |

Mask matrix (24Rows196Columns)

| H4 | 356 |
|---|---|
| H5 | 363 |
| Comparative example | 3714 |

Mask matrix (48Rows392Columns)

| H6 | 122 |
|---|---|
| H7 | 124 |
| Comparative example | 7430 |

FIG. 29

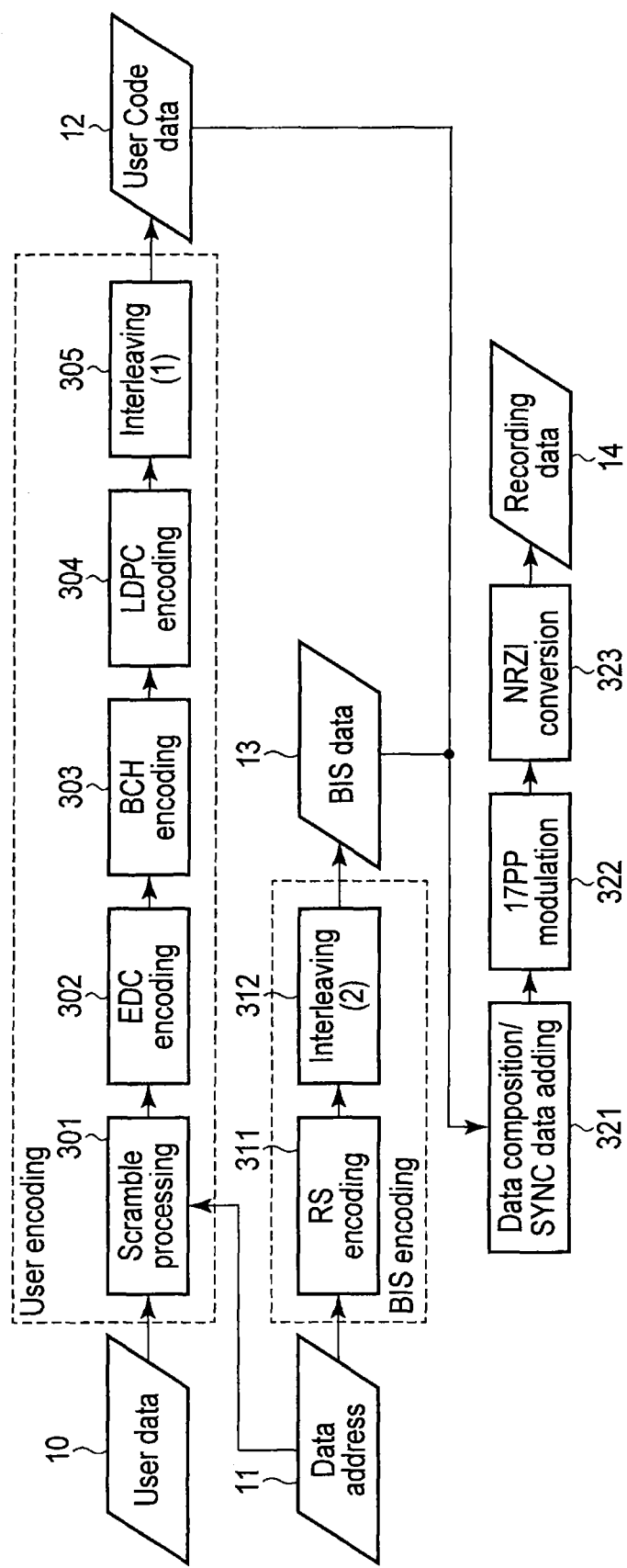
F I G. 30

|       | SYNC (1) | User Code (1,1) | BIS (1,1) | User Code (1,2) | BIS (1,2) | User Code (1,3) | BIS (1,3) | User Code (1,4) |
|-------|----------|-----------------|-----------|-----------------|-----------|-----------------|-----------|-----------------|
| No.1  | SYNC (1) | User Code (1,1) | BIS (1,1) | User Code (1,2) | BIS (1,2) | User Code (1,3) | BIS (1,3) | User Code (1,4) |
| No.2  | SYNC (2) | User Code (2,1) | BIS (2,1) | User Code (2,2) | BIS (2,2) | User Code (2,3) | BIS (2,3) | User Code (2,4) |
| No.3  | SYNC (3) | User Code (3,1) | BIS (3,1) | User Code (3,2) | BIS (3,2) | User Code (3,3) | BIS (3,3) | User Code (3,4) |
| ...   | ...      | ...             | ...       | ...             | ...       | ...             | ...       | ...             |
| No.(S-2) | SYNC (S-2) | User Code (S-2,1) | BIS (S-2,1) | User Code (S-2,2) | BIS (S-2,2) | User Code (S-2,3) | BIS (S-2,3) | User Code (S-2,4) |
| No.(S-1) | SYNC (S-1) | User Code (S-1,1) | BIS (S-1,1) | User Code (S-1,2) | BIS (S-1,2) | User Code (S-1,3) | BIS (S-1,3) | User Code (S-1,4) |
| No.S  | SYNC (S) | User Code (S,1) | BIS (S,1) | User Code (S,2) | BIS (S,2) | User Code (S,3) | BIS (S,3) | User Code (S,4) |

F I G. 31

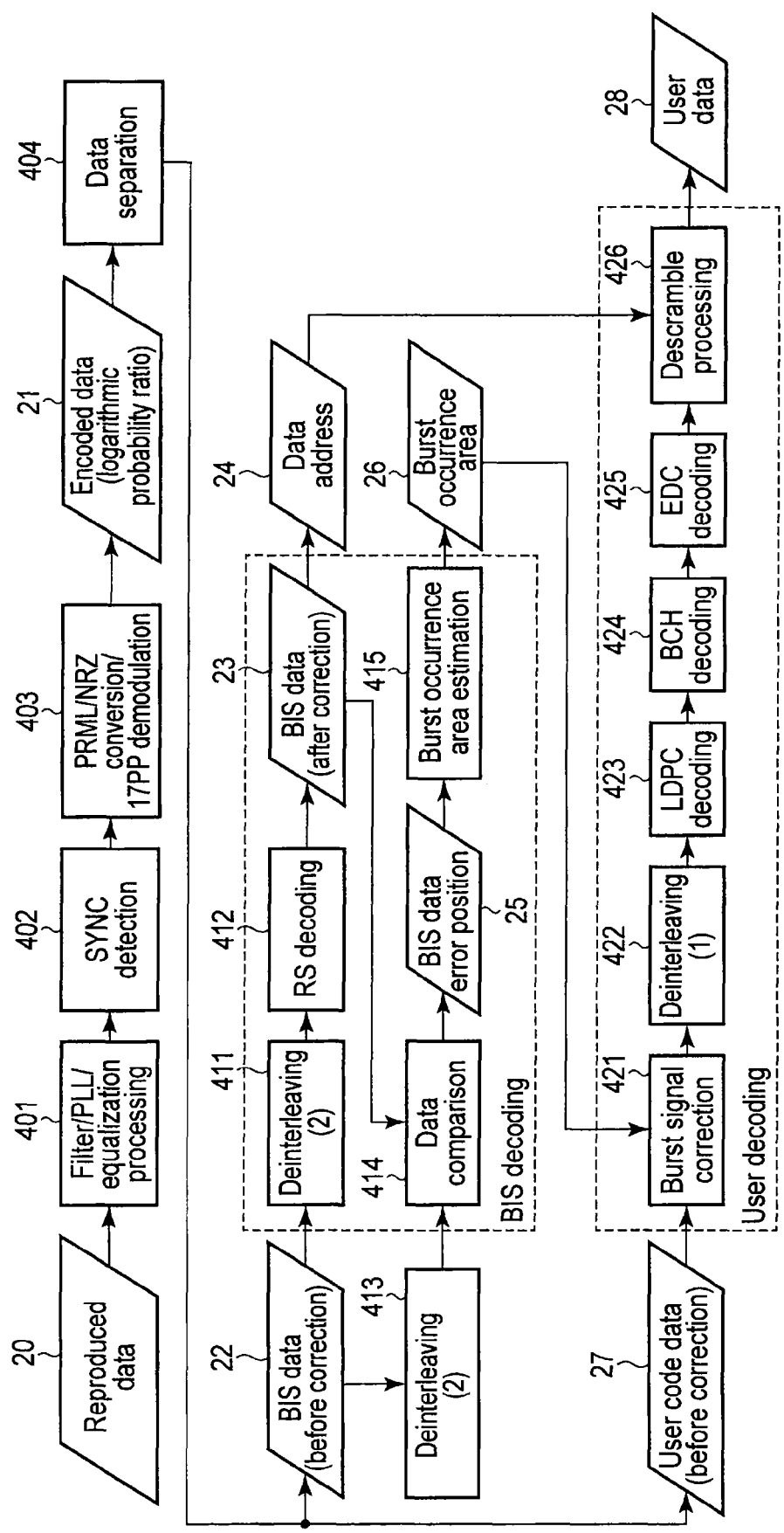
F I G. 32

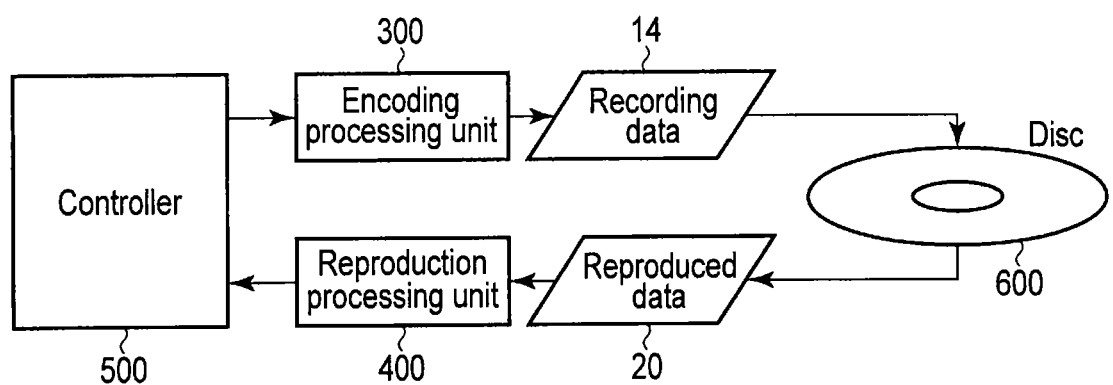
F I G. 34

PARITY CHECK MATRIX CREATION METHOD, ENCODING APPARATUS, AND RECORDING/REPRODUCTION APPARATUS

CROSS-REFERENCE TO RELATED APPLICATIONS

This application is a Continuation Application of PCT Application No. PCT/JP2012/056933, filed Mar. 16, 2012, the entire contents of which are incorporated herein by reference.

FIELD

Embodiments described herein relate generally to an error correcting code.

BACKGROUND

In recent years, recording media are increasing in capacity. As the capacities of recording media increase, the reproduction environment becomes stricter. For example, an optical recording medium achieves a large capacity by improving the line density of record marks, forming an information recording layer having a multilayer structure, and the like. On the other hand, reproduced data readily includes errors, resulting in deterioration of the reproduction environment. Hence, there is demanded a signal processing technique capable of accurately reconstructing reproduced data even under such a reproduction environment.

There have been proposed various kinds of error correcting code methods to correct errors in data in recording/reproduction systems and communication systems. An LDPC (Low Density Parity Check) code is known to have an excellent error correcting capability. In particular, the LDPC code exhibits an outstanding characteristic for random errors. However, the LDPC code does not necessarily exhibit a satisfactory characteristic for burst errors (continuous errors) that occur due to defects in a recording medium or the like. For this reason, particularly when applying the LDPC code to a recording/reproduction system, improved resistance to burst errors has been demanded.

BRIEF DESCRIPTION OF THE DRAWINGS

FIG. 3 is an explanatory view of a technique of evaluating the resistance of an LDPC code corresponding to the parity check matrix shown in FIG. 1 to a burst error.

FIG. 4 is an explanatory view of a technique of evaluating the resistance of an LDPC code corresponding to the parity check matrix shown in FIG. 1 to a burst error.

FIG. 5 is an explanatory view of a technique of evaluating the resistance of an LDPC code corresponding to the parity check matrix shown in FIG. 1 to a burst error.

FIG. 6 is an explanatory view of a technique of evaluating the resistance of an LDPC code corresponding to the parity check matrix shown in FIG. 1 to a burst error.

FIG. 7 is an explanatory view of a technique of evaluating the resistance of an LDPC code corresponding to the parity check matrix shown in FIG. 1 to a burst error.

FIG. 8 is an explanatory view of a technique of evaluating the resistance of an LDPC code corresponding to the parity check matrix shown in FIG. 1 to a burst error.

FIG. 9 is an explanatory view of a technique of evaluating the resistance of an LDPC code corresponding to the parity check matrix shown in FIG. 1 to a burst error.

FIG. 10 is an explanatory view of a technique of evaluating the resistance of an LDPC code corresponding to the parity check matrix shown in FIG. 1 to a burst error.

FIG. 11 is an explanatory view of the resistance of an LDPC code corresponding to a mask matrix according to a comparative example to a plurality of burst errors.

FIG. 12 is an explanatory view of the resistance of an LDPC code corresponding to a mask matrix created by a parity check matrix creation method according to the first embodiment to a plurality of burst errors.

FIG. 13 is a flowchart showing processing of creating the initial matrix of a mask matrix.

FIG. 14 is an explanatory view of processing of creating the initial matrix of a mask matrix.

FIG. 15 is an explanatory view of processing of creating the initial matrix of a mask matrix.

FIG. 16 is an explanatory view of processing of creating the initial matrix of a mask matrix.

FIG. 17 is an explanatory view of processing of creating the initial matrix of a mask matrix.

FIG. 18 is an explanatory view of processing of creating the initial matrix of a mask matrix.

FIG. 19 is an explanatory view of processing of creating the initial matrix of a mask matrix.

FIG. 20 is an explanatory view of processing of creating the initial matrix of a mask matrix.

FIG. 22A is a view showing part of a parity check matrix (H2) created by the parity check matrix creation method according to the first embodiment.

FIG. 22B is a view showing part of the parity check matrix (H2).

FIG. 22C is a view showing part of the parity check matrix (H2).

FIG. 23A is a view showing part of a parity check matrix (H3) created by the parity check matrix creation method according to the first embodiment.

FIG. 23B is a view showing part of the parity check matrix (H3).

FIG. 23C is a view showing part of the parity check matrix (H3).

FIG. 24A is a view showing part of a parity check matrix (H4) created by the parity check matrix creation method according to the first embodiment.

FIG. 24B is a view showing part of the parity check matrix (H4).

FIG. 24C is a view showing part of the parity check matrix (H4).

FIG. 24D is a view showing part of the parity check matrix (H4).

FIG. 24E is a view showing part of the parity check matrix (H4).

FIG. 24F is a view showing part of the parity check matrix (H4).

FIG. 25A is a view showing part of a parity check matrix (H5) created by the parity check matrix creation method according to the first embodiment.

FIG. 25B is a view showing part of the parity check matrix (H5).

FIG. 25C is a view showing part of the parity check matrix (H5).

FIG. 25D is a view showing part of the parity check matrix (H5).

FIG. 25E is a view showing part of the parity check matrix (H5).

FIG. 25F is a view showing part of the parity check matrix (H5).

FIG. 26A is a view showing part of a parity check matrix (H6) created by the parity check matrix creation method according to the first embodiment.

FIG. 26B is a view showing part of the parity check matrix (H6).

FIG. 26C is a view showing part of the parity check matrix (H6).

FIG. 26D is a view showing part of the parity check matrix (H6).

FIG. 26E is a view showing part of the parity check matrix (H6).

FIG. 26F is a view showing part of the parity check matrix (H6).

FIG. 26G is a view showing part of the parity check matrix (H6).

FIG. 26H is a view showing part of the parity check matrix (H6).

FIG. 26I is a view showing part of the parity check matrix (H6).

FIG. 26J is a view showing part of the parity check matrix (H6).

FIG. 26K is a view showing part of the parity check matrix (H6).

FIG. 27A is a view showing part of a parity check matrix (H7) created by the parity check matrix creation method according to the first embodiment.

FIG. 27B is a view showing part of the parity check matrix (H7).

FIG. 27C is a view showing part of the parity check matrix (H7).

FIG. 27D is a view showing part of the parity check matrix (H7).

FIG. 27E is a view showing part of the parity check matrix (H7).

FIG. 27F is a view showing part of the parity check matrix (H7).

FIG. 27G is a view showing part of the parity check matrix (H7).

FIG. 27H is a view showing part of the parity check matrix (H7).

FIG. 27I is a view showing part of the parity check matrix (H7).

FIG. 27J is a view showing part of the parity check matrix (H7).

FIG. 27K is a view showing part of the parity check matrix (H7).

FIG. 28 is a view showing the calculation result of the resistances of the parity check matrices (H2, H3 H4, H5, H6, and H7) to a burst error.

FIG. 29 is a view showing the comparison result of the number of occurrences of 4-loops between the mask matrix of the comparative example and those created by the parity check matrix creation method according to the first embodiment.

FIG. 30 is a block diagram showing an encoding processing unit as part of a recording/reproduction apparatus according to the second embodiment.

FIG. 31 is a view showing the format of combined data of user code data, BIS data, and SYNC data.

FIG. 32 is a block diagram showing a reproduction processing unit as part of the recording/reproduction apparatus according to the second embodiment.

FIG. 34 is a block diagram showing the recording/reproduction apparatus according to the second embodiment.

DETAILED DESCRIPTION

Figures 1, 2:
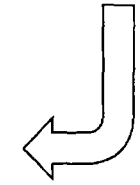
FIG. 1 is a view showing a parity check matrix of an LDPC code.
FIG. 2 is an explanatory view of a technique of evaluating the resistance of an LDPC code corresponding to the parity check matrix shown in FIG. 1 to a burst error.

Embodiments will now be described with reference to the accompanying drawings.

According to an embodiment, a parity check matrix creation method includes creating a mask matrix whose column weight is K (K is an integer not less than 2) by assigning one of "1" and "0" to each element of M rows×N columns (M is an integer not less than 4, and N is an integer larger than M). The method further includes creating a parity check matrix by, for each element in the mask matrix, arranging a cyclic permutation matrix having P rows×P columns (P is an integer not less than 2) at a corresponding position when the element is "1" and arranging a zero matrix having P rows×P columns at a corresponding position when the element is "0". All N column vectors in the mask matrix are different. A submatrix having M rows×L columns (L is an integer not more than (M−K+1)) obtained by arbitrarily extracting L continuous columns from the mask matrix includes: $B_1$ ($B_1$ is an integer not less than 1) first correction rows; and $B_i$ ($B_i$ is an integer not less than 1, i includes all integers not less than 2 and not more than I, and I is an integer not less than 2) ith correction rows. Each of the $B_1$ first correction rows has a row weight of 1. The $B_1$ first correction rows have at least one "1" in total in each of $A_1$ ($A_1$ is an integer not less than 1 and not more than $B_1$) first correction columns. Each of the $B_i$ ith correction rows has a row weight of not less than 2. Each of the $B_i$ ith correction rows has at least one "1" in total in $A_{i-1}$ ($A_{i-1}$ is an integer not less than 1 and not more than $B_{i-1}$) (i−1)th correction columns. Each of the $B_i$ ith correction rows has "1" in one of $A_i$ ($A_i$ is an integer not less than 1 and not more than $B_i$) ith correction columns included in a column set excluding the first correction columns to (i−1)th correction columns. The $B_i$ ith correction rows include at least one "1" in total in each of the $A_i$ ith correction columns. A sum from $A_1$ to $A_I$ equals L. $B_i$ is not more than $A_{i-1} \times (K-1)$.

Note that the same or similar reference numerals denote elements that are the same as or similar to those already explained, and a repetitive description will basically be omitted.

(First Embodiment)

The first embodiment is directed to a method of creating a parity check matrix that defines an LDPC code having a satisfactory resistance to a burst error.

The resistance of an LDPC code to a burst error can be evaluated based on a parity check matrix that defines the LDPC code, as will be described below.

FIG. 1 shows a parity check matrix (H1). The parity check matrix (H1) defines an LDPC code having an information length of 6 bits, a parity length of 6 bits, and a code length of 12 bits. In the following description, code data is expressed by, for example, a format C=($c_1, c_2, \ldots, c_{11}, c_{12}$).

Basically, an LDPC code is decoded by iterating correction processing of correcting errors on a row basis based on a result of parity check and propagation processing of propagating the error correction result of each row in the row direction. Rows (that is, check nodes) and columns (that is, variable nodes) corresponding to elements "1" of a parity check matrix are involved in the correction processing and the propagation processing.

For example, according to the parity check matrix (H1), the first, second, third, and fourth columns (that is, c1, c2, c3, and c4) of the first row are the subjects of correction processing. The subjects of correction processing in other rows are also decided in this way. According to the parity check matrix (H1), the error correction result of the first column (that is, c1) of the first row propagates to the fourth row, and the error correction result of the first column of the fourth row propagates to the first row. Other error correction results also propagate in this way.

Assume that a burst error occurs from the eighth bit (c8) up to the 10th bit (c10) of the LDPC code defined by the parity check matrix (H1), and no error occurs in the remaining bits. In this case, whether the burst error is correctable can be determined based on column vectors from the eight column up to the 10th column of the parity check matrix (H1).

More specifically, as shown in FIG. 2, a submatrix (Hsub_1) formed from the column vectors from the eighth column up to the 10th column of the parity check matrix (H1) can be extracted from the parity check matrix (H1). Focusing on the matrix (Hsub_1), none of the bits of the first and sixth rows are included in the subjects of correction processing. In the second row, the eighth bit is the subject of correction processing. In the third row, the ninth and 10th bits are the subjects of correction processing. In the fourth row, the eighth and 10th bits are the subjects of correction processing. In the fifth row, the ninth bit is the subject of correction processing.

In the following description, elements of columns that are not the subjects of correction processing in the rows of the matrix (Hsub_1) will be expressed as "-", and elements of columns that are the subjects of correction processing will be expressed as "○" or "x". Symbol "○" indicates that the error is corrected, and symbol "x" indicates that the error is not corrected. When performing correction processing of the first time, the burst error that has occurred from the eighth column up to the 10th column is not corrected. Hence, a matrix (Hsub_1a) shown in FIG. 3 is obtained.

In terms of the working principle of the LDPC code, when only one error bit is included in a row of interest, the error can be corrected at a time by correction processing on a row-by-row basis. However, when two or more error bits are included in the row of interest, the errors cannot be corrected at a time. For this reason, in the second and fifth rows each including one uncorrected bit of the subjects of correction processing, the errors are corrected by correction processing of the first time. However, in the third and fourth rows each including two or more uncorrected bits of the subjects of correction processing, the errors are not corrected. Hence, a matrix (Hsub_1b) shown in FIG. 4 is obtained as the result of correction processing of the first time.

As described above, according to propagation processing, the error correction result of each row propagates in the row direction. More specifically, the error of the eighth bit of the second row and the error of the ninth bit of the fifth row are corrected by correction processing of the first time. The error correction result of the eighth bit of the second row propagates to the fourth row in which the eighth bit is likewise the subject of correction processing. The error correction result of the ninth bit of the fifth row propagates to the third row in which the ninth bit is likewise the subject of correction processing. Hence, a matrix (Hsub_1c) shown in FIG. 5 is obtained as the result of propagation processing of the first time.

Focusing on the matrix (Hsub_1c), the number of uncorrected bits of the subjects of correction processing decreases from 2 to 1 in each of the third and fourth rows in correction processing of the second time. For this reason, the errors are corrected in the third and fourth rows by correction processing of the second time. That is, a matrix (Hsub_1d) shown in FIG. 6 is obtained. As shown in FIG. 6, according to the parity check matrix (H1), even when a burst error occurs from the eighth bit (c8) up to the 10th bit (c10) of code data, the burst error can be corrected if no error occurs in the remaining bits.

Assume that a burst error occurs from the fifth bit (c5) up to the seventh bit (c7) of the LDPC code defined by the parity check matrix (H1), and no error occurs in the remaining bits. In this case, whether the burst error is correctable can be determined based on column vectors from the fifth column up to the seventh column of the parity check matrix (H1).

More specifically, as shown in FIG. 7, a submatrix (Hsub_2) formed from the column vectors from the fifth column up to the seventh column of the parity check matrix (H1) can be extracted from the parity check matrix (H1). Focusing on the matrix (Hsub_2), none of the bits of the first, third, and fourth rows are included in the subjects of correction processing. In the second row, the fifth, sixth, and seventh bits are the subjects of correction processing. In the fifth row, the fifth and seventh bits are the subjects of correction processing. In the sixth row, the sixth bit is the subject of correction processing.

In the following description, elements of columns that are not the subjects of correction processing in the rows of the matrix (Hsub_2) will be expressed as "-", and elements of columns that are the subjects of correction processing will be expressed as "○" or "x". Symbol "○" indicates that the error is corrected, and symbol "x" indicates that the error is not corrected. When performing correction processing of the first time, the burst error that has occurred from the fifth column up to the seventh column is not corrected. Hence, a matrix (Hsub_2a) shown in FIG. 8 is obtained.

In the sixth row including one uncorrected bit of the subjects of correction processing, the error is corrected by correction processing of the first time. However, in the second and fifth rows each including two or more uncorrected bits of the subjects of correction processing, the errors are not corrected. Hence, a matrix (Hsub_2b) shown in FIG. 9 is obtained as the result of correction processing of the first time.

The error of the sixth bit of the sixth row is corrected by correction processing of the first time. The error correction result of the sixth bit of the sixth row propagates to the second row in which the sixth bit is likewise the subject of correction processing. Hence, a matrix (Hsub_2c) shown in FIG. 10 is obtained as the result of propagation processing of the first time.

According to the working principle of the LDPC code, if a row including two or more uncorrected bits of the subjects of correction processing remain, and no row including one uncorrected bit of the subjects of correction processing remains, at the time of performing correction processing of (i+1)th time (i is the number of iterated decoding processes (that is, correction processes and propagation processes)), the errors cannot be corrected even by correction processing and propagation processing of the (i+1)th and subsequent times. Focusing on the matrix (Hsub_2c), the number of uncorrected bits of the subjects of correction processing decreases from 3 to 2 in the sixth row in correction processing of the second time. However, each of the second and fifth rows still includes two or more uncorrected bits, and no row including one uncorrected bit of the subjects of correction processing remains. For this reason, the errors of the fifth and seventh bits cannot be corrected even by iterating correction processing and propagation processing. Hence, according to the parity check matrix (H1), when a burst error occurs from the fifth bit (c5) up to the seventh bit (c7) of code data, the burst error cannot be corrected.

As described above, when a submatrix corresponding to an assumed burst error is extracted from a parity check matrix and analyzed, the resistance of an LDPC code defined by the parity check matrix to the burst error can be evaluated. Note that assuming a burst error means defining the number of occurrences and the occurrence area and occurrence scale of each burst error.

It is not easy to design an LDPC code that stably exhibits a high resistance to a burst error that can occur on various scales in various areas. Regarding this problem, a related art (William E. Ryan and Shu Lin, "Channel Codes Classical and Modern") proposes a technique of designing a quasi-cyclic LDPC code guaranteed to be able to correct a burst error up to at least $(M-K) \times P+1$ bits when the number of burst error occurrences is 1, where M is the row size of the mask matrix to be described later, K is the column weight of the mask matrix, and P is the size of a block matrix corresponding to the elements of the mask matrix.

The mask matrix represents the structure of a corresponding parity check matrix. More specifically, the parity check matrix arranges block matrices in number corresponding to the row size in the row direction and block matrices in number corresponding to the column size in the column direction. Each block matrix is a cyclic permutation matrix having P rows×P columns or a zero matrix having P rows×P columns. Each element in the mask matrix represents whether each block matrix in the parity check matrix is the cyclic permutation matrix or zero matrix.

For example, the mask matrix has "1" or "0" as an element. An element "1" represents that the corresponding block matrix in the parity check matrix is a cyclic permutation matrix. An element "0" represents that the corresponding block matrix in the parity check matrix is a zero matrix. That is, a block matrix having P rows×P columns including the element of the $((m-1) \times P+1)$th row and the $((n-1) \times P+1)$th column of the parity check matrix is a cyclic permutation matrix when the element of the mth row and the nth column of the mask matrix is "1" or a zero matrix when the element is "0".

The mask matrix is derived by connecting submatrices (G) each having M rows×M columns to be described later in an arbitrary connection number in the column direction, as indicated by $$Z1 = [GG \ldots GG] \quad (1)$$

In expression (1), Z1 represents the mask matrix. When, for example, M=8 and K=4, the submatrix (G) can be derived by $$G = \begin{pmatrix} 1 & 0 & 0 & 0 & 0 & 1 & 1 & 1 \\ 1 & 1 & 0 & 0 & 0 & 0 & 1 & 1 \\ 1 & 1 & 1 & 0 & 0 & 0 & 0 & 1 \\ 1 & 1 & 1 & 1 & 0 & 0 & 0 & 0 \\ 0 & 1 & 1 & 1 & 1 & 0 & 0 & 0 \\ 0 & 0 & 1 & 1 & 1 & 1 & 0 & 0 \\ 0 & 0 & 0 & 1 & 1 & 1 & 1 & 0 \\ 0 & 0 & 0 & 0 & 1 & 1 & 1 & 1 \end{pmatrix} \quad (2)$$

An LDPC code corresponding to the mask matrix derived by expressions (1) and (2) can correct a burst error over five blocks when the number of burst error occurrences is 1 according to the above-described evaluation technique. More specifically, when the number of connected submatrices (G) in the mask matrix (Z1) is 8, the coding rate of the LDPC code is ⅞ $(=(8M-M)/8M)$. In addition, when the size (P) of the block matrix is 72, the LDPC code is guaranteed to be able to correct a burst error of 289 $(=(8-4) \times 72+1)$ bits when the number of burst error occurrences is 1.

When the mask matrix (Z1) of expression (1) is generalized, a mask matrix (Z2) represented by expression (3) is obtained. The mask matrix (Z2) is derived by connecting submatrices (Ga) each having M rows×M columns to be described later in an arbitrary connection number in the column direction. In the following explanation, the mask matrix (Z1 or Z2) represented by expression (1) or (3) will be referred to as a mask matrix according to a comparative example.

$$Z2 = [Ga\, Ga \ldots Ga\, Ga] \quad (3)$$

The submatrix (Ga) of expression (3) is formed from a first block matrix ($G_L$) having K rows×K columns, a second block matrix ($G_U$) having K rows×K columns, and a zero matrix having K rows×K columns, as indicated by $$Ga = \begin{pmatrix} G_L & 0 & \cdots & 0 & 0 & G_U \\ G_U & G_L & \ddots & \vdots & \vdots & 0 \\ 0 & G_U & \ddots & 0 & \vdots & \vdots \\ \vdots & 0 & \ddots & G_L & 0 & \vdots \\ \vdots & \vdots & \ddots & G_U & G_L & 0 \\ 0 & 0 & \cdots & 0 & G_U & G_L \end{pmatrix} \quad (4)$$

The first block matrix ($G_L$) is represented by $$G_L = \begin{pmatrix} 1 & 0 & \cdots & 0 \\ \vdots & 1 & \ddots & \vdots \\ \vdots & \vdots & \ddots & 0 \\ 1 & 1 & \cdots & 1 \end{pmatrix} \quad (5)$$

and the second block matrix ($G_U$) is represented by $$G_U = \begin{pmatrix} 0 & 1 & \cdots & 1 \\ \vdots & 0 & \ddots & \vdots \\ \vdots & \vdots & \ddots & 1 \\ 0 & 0 & \cdots & 0 \end{pmatrix} \quad (6)$$

Each mask matrix according to the comparative example is formed by connecting a plurality of submatrices (G or Ga). For this reason, in these mask matrices, column vectors appear at a predetermined period according to the row size of the mask matrices. For example, in the mask matrix (Z1) represented by expression (1), the same identical column vector appears every eight columns, as shown in FIG. 11, because the row size=8.

Hence, if the number of burst error occurrences is 2 or more, each mask matrix according to the comparative example may be unable to correct these burst errors regardless of the number of burst error occurrences and the scale of each burst error. For example, assume that a first burst error occurs in an area including the first, ..., Pth bits corresponding to the first column of the mask matrix (Z1), and a second burst error occurs in an area including the (8P+1)th, ..., (9P)th bits corresponding to the ninth column of the mask matrix (Z1). In this case, when performing correction processing of the first time, a row including two or more uncorrected bits of the subjects of correction processing remain, and no row including one uncorrected bit of the subjects of correction processing remains. It is therefore impossible to correct the errors even by the correction processing and propagation processing of the first and subsequent times.

That is, if a column vector corresponding to the occurrence area of a given burst error matches a column vector corresponding to the occurrence area of another burst error in the mask matrix, these burst errors cannot be corrected. In each mask matrix according to the comparative example, the number of appearances of the same column vector increases as the number of connected submatrices increases. Hence, the higher the coding rate is designed to be, the larger the number of uncorrectable burst error patterns becomes. This degrades the resistance of the LDPC code to the burst errors.

In each mask matrix according to the comparative example, a 4-loop that degrades the performance of the LDPC code is readily generated. This is because the same column vector repetitively appears, and the number of overlaps of rows where the element "1" appears between adjacent column vectors is large (more specifically, K−1). The number of overlaps increases as the column weight of the mask matrix increases. That is, as the column weight of the mask matrix increases, many 4-loops are generated in the mask matrix.

According to the mask matrices of the comparative example, when a burst error over L columns occurs, the burst error can sequentially be corrected on a column basis from both ends. In other words, errors in two columns are corrected at maximum by one correction processing. For this reason, the number of iterated decoding processes (that is, the number of correction processes and propagation processes) necessary to correct a burst error over L columns is L/2 (rounded up when L is an odd number). That is, the necessary number of iterated decoding processes linearly increases with respect to the scale (L) of the burst error. Note that the above mentioned related art above does not disclose a technique of creating a mask matrix capable of correcting errors in three or more columns by one correction process.

In this embodiment, the parity check matrix is created by the following method.

This method includes assigning one of "1" and "0" to each element of M rows×N columns, thereby creating a mask matrix having a column weight K, where M is an integer of 4 or more, N is an integer larger than M, and K is an integer of 2 or more.

This method further includes, for each element in the created mask matrix, arranging a cyclic permutation matrix having P rows×P columns at a corresponding position when the element is "1" and arranging a zero matrix having P rows×P columns at a corresponding position when the element is "0", thereby creating a parity check matrix, where P is an integer of 2 or more.

Note that the mask matrix created by this method meets at least following conditions (a), (b), (c), (d), (e), and (f).

(a) All of N column vectors in the mask matrix are different.

When the condition (a) is met, only (K−1) rows where the element "1" appears overlap at maximum between two arbitrary column vectors in the mask matrix, as shown in FIG. 12. That is, even when the first burst error and the second burst error occur in two arbitrary columns of the mask matrix, the burst errors can be corrected. For this reason, the LDPC code corresponding to this mask matrix has an improved resistance to a plurality of burst errors as compared to the LDPC code corresponding to each mask matrix according to the comparative example.

(b) A submatrix having M rows×L columns obtained by extracting L (L is an integer of (M−K+1) or less) arbitrary continuous columns from the mask matrix includes $B_1$ ($B_1$ is an integer of 1 or more) first correction rows.

The first correction rows indicate $B_1$ rows in which all errors in the rows are corrected for the first time by correction processing of the first time. For this reason, the row weight of each of the $B_1$ first correction rows needs to be 1.

(c) The $B_1$ first correction rows have at least one "1" in total in each of $A_1$ ($A_1$ is an integer of 1 or more) first correction columns.

The first correction columns indicate $A_1$ columns corrected in the $B_1$ first correction rows by correction processing of the first time. In other words, all columns having "1" arranged in the $B_1$ first correction rows are handled as the first correction columns. Hence, the total number ($A_1$) of first correction columns is $B_1$ at maximum. If columns corrected by correction processing of the first time overlap between the $B_1$ first correction rows, $A_1<B_1$. On the other hand, if columns corrected by correction processing of the first time do not overlap at all between the $B_1$ first correction rows, $A_1=B_1$.

(d) The submatrix further includes $B_i$ ($B_i$ is an integer of 1 or more, i includes all integers from 1 to I, and I is an integer of 2 or more) ith correction rows.

The ith correction rows indicate $B_i$ rows in which all errors in the rows are corrected for the first time by correction processing of the ith time. In other words, the number of uncorrected bits needs to decrease from 2 or more to 1 in the $B_i$ ith correction rows by propagating the error correction result of the (i−1)th time by propagation processing of the (i−1)th time. For this reason, the row weight of each of the $B_i$ ith correction rows is 2 or more. In addition, each of the $B_i$ ith correction rows has at least one "1" in total in $A_{i-1}$ (i−1)th correction columns. In this regard, the maximum number of (i−1)th propagation rows to which the error correction result of the (i−1)th time is propagated by propagation processing of the (i−1)th time is $A_{i-1}\times(K-1)$. Hence, $$B_i \le A_{i-1}\times(K-1) \quad (7)$$

holds for $B_i$.

(e) Each of the $B_i$ ith correction rows has "1" in one of $A_i$ ($A_i$ is an integer of 1 or more) ith correction columns included in a column set excluding the first correction columns to the (i−1)th correction columns, and the $B_i$ ith correction rows include at least one "1" in total in each of the ith correction columns.

The ith correction columns indicate $A_i$ columns corrected in the ith correction rows by correction processing of the ith time. In other words, all columns having "1" arranged in the $B_i$ ith correction rows of the column set excluding the first correction columns to the (i−1)th correction columns are handled as the ith correction columns. Hence, the total number ($A_i$) of ith correction columns is $B_i$ at maximum. If columns corrected by correction processing of the ith time overlap between the $B_i$ ith correction rows, $A_i<B_i$. On the other hand, if columns corrected by correction processing of the ith time do not overlap at all between the $B_i$ ith correction rows, $A_i = B_i$. In this case, the $B_i$ ith correction rows have a total of one "1" in each of the $A_i$ ith correction columns. Hence, $A_i \le B_i$ holds. From expression (7), $$A_i \le A_{i-1} \times (K-1) \tag{8}$$

holds.

(f) The sum from $A_1$ to $A_I$ equals L.

When the condition (f) is met, a burst error over L rows of the mask matrix can be corrected by I iterated decoding processes.

According to a mask matrix that meets the conditions (a), (b), (c), (d), (e), and (f), a burst error over L columns (L is an integer of 1 to (M−K+1) or less) that has occurred at an arbitrary position can be corrected, as will be described below.

To correct a burst error over L columns, at least one correction row is necessary for each column included in the L columns to correct errors in the column. According to the conditions (c) and (e), the first correction column is corrected in at least one first correction row. Similarly, the ith correction column is corrected in at least one ith correction row. For this reason, according to the mask matrix that meets the conditions (a), (b), (c), (d), (e), and (f), a burst error over L columns (L is an integer of 1 to (M−K+1) or less), which occurs at an arbitrary position, can be corrected.

In addition, according to the mask matrix that meets the conditions (a), (b), (c), (d), (e), and (f), the upper limit of L is M−K+1, as will be described below.

As described concerning the conditions (c) and (e), $B_1 \ge A_1$ and $B_i \ge A_i$. According to the condition (f), the sum from $A_1$ to $A_I$ is L. Hence, the sum from $B_1$ to $B_I$ is L or more. For this reason, the sum (M") from $B_1$ to $B_{I-1}$ is $L-A_I$ or more.

In this case, when $A_I=1$, the submatrix includes not only the first to (I−1)th correction rows but also at least the Ith correction rows. When $A_I=1$, $B_I=K$. Hence, when $A_I=1$, $M-M'' \ge A_I + K - 1$ holds.

On the other hand, when $A_I \ge 2$, the submatrix includes not only the first to (I−1)th correction rows but also at least the Ith correction rows. In addition, Ith propagation rows to which the error correction result of the ith correction row propagates may exist. Each of the Ith propagation rows has two or more "1" in the $A_I$ first correction columns. If each of (K−1) Ith propagation rows has "1" in all of $A_I$ Ith correction columns, the sum of the total number of Ith correction rows and the total number of Ith propagation rows is minimized to $A_I+K-1$. Hence, even when $A_I \ge 2$, $M-M'' \ge A_I+K-1$ holds.

Hence, it can be confirmed that the upper limit value of L is M−K+1 by $$M-(L-A_I) \ge M-M'' \ge A_I+K-1$$

$$M-(L-A_I) \ge A_I+K-1$$

$$M-L \ge K-1$$

$$L \le M-K+1 \tag{9}$$

Note that to make L reach the upper limit value (M−K+1), $M-(L-A_I)=M-M''$ and $M-M''=A_I+K-1$ need to hold, as is apparent from expression (9).

To make $M-(L-A_I)=M-M''$ hold, the sum from $A_1$ to $A_{I-1}$ and the sum from $B_1$ to $B_{I-1}$ need to match. As described above, $B_1, \ldots, B_{I-1}$ are equal to or larger than $A_1, \ldots, A_{I-1}$, respectively. Hence, to make the sum from $A_1$ to $A_{I-1}$ and the sum from $B_1$ to $B_{I-1}$ match, $B_1=A_1, \ldots, B_{I-1}=A_{I-1}$ need to hold, respectively.

To allow $M-M''=A_I+K-1$ to hold when $A_I=1$, a total of K rows including the Ith correction rows need to remain in a row set formed by excluding the first to (I−1)th correction rows from the submatrix. As described above, when $A_I=1$, $B_I$ does not become smaller than K. For this reason, to allow $M-M''=A_I+K-1$ to hold when $A_I=1$, $B_I=K$ needs to hold. In addition, to make $B_I=K$ hold, $A_{I-1} \ge 2$ needs to hold based on expression (7).

To allow $M-M''=A_I+K-1$ to hold when $A_I \ge 2$, a total of $(A_I+K-1)$ rows including the Ith correction rows and the Ith propagation rows need to remain in a row set formed by excluding the first to (I−1)th correction rows from the submatrix. As described above, when $A_I \ge 2$, the sum of the total number of Ith correction rows and the total number of the Ith propagation rows does not become smaller than $A_I+K-1$. For this reason, to allow $M-M''=A_I+K-1$ to hold when $A_I \ge 2$, $B_I=A_I$ needs to hold. In addition, the submatrix needs to include (K−1) Ith propagation rows having "1" in all the $A_I$ Ith correction columns.

A parity check matrix creation method according to this embodiment will be described below in detail. In this embodiment, a submatrix having M rows×L columns called an initial matrix ($M_{ini}$) is created, and the number of columns of the initial matrix is extended from L to N, thereby creating a mask matrix, where M is the row size of the mask matrix. $L \le M-K+1$, and K represents the column weight of the mask matrix. In addition, L represents the burst error length correctable by an LDPC code corresponding to the mask matrix.

FIG. 13 shows the creation processing of the initial matrix ($M_{ini}$). The processing shown in FIG. 13 can be executed by a processor connected to a memory. Typically, a computer executes the processing shown in FIG. 13. The processing shown in FIG. 13 starts from step S101.

In step S101, the initial matrix ($M_{ini}$) is initialized. More specifically, a zero matrix having M rows×L columns is created in the work area of the memory. In addition, the total number ($A_i$) of the ith correction columns ($C_i$) is set (step S102). The ith correction columns ($C_i$) indicates a column to be corrected in the ith correction row ($R_i$) by correction processing of the ith time, where i is a variable that specifies the number of iterated decoding processes, and $1 \le i \le I$. In addition, $A_i \ge 1$. I is a value representing the number of iterated decoding processes necessary to attain a burst error correction over L columns, and is preferably set to L/2 or less. In addition, $$\sum_{i=1}^{I} A_i = L \tag{10}$$

holds concerning $A_i$ and I.

In step S103, i=1 is set, and the process advances to step S104. In step S104, $B_1$ first correction rows ($R_1$) are created. Note that $B_1 \ge A_1$. Here, the first correction row indicates a row including one uncorrected bit of the subjects of correction processing of the first time. For this reason, the row weight is 1 in all first correction rows. $B_1$ first correction rows have at least one "1" in total in each of $A_1$ different columns (that is, first correction columns). After step S104, the process advances to step S105.

In step S105, the ith correction columns ($C_i$) are extracted. As is set in step S102, $A_i$ ith correction columns ($C_i$) exist. Focusing on the ith correction columns ($C_i$) extracted in step S105, $A_{i+1}$ or more ith propagation rows ($R'_i$) are created (step S106). The ith propagation row ($R'_i$) indicates a row to which at least one error correction result in total propagates from the ith correction columns. That is, the ith propagation row ($R'_i$) has at least one "1" in the $A_i$ ith correction columns. However, rows already created as the first, . . . , ith correction rows ($R_1$, . . . , $R_i$) are excluded from the candidates of the ith propagation rows. The column weight of each ith correction column ($C_i$) is adjusted to K by "1" assigned to the ith propagation rows.

When the ith propagation rows ($R'_i$) are created in step S106, the ith correction columns ($C_i$) are decided. Hence, the ith correction columns ($C_i$) are deleted from the work area of the memory (step S107). When all columns are deleted from the work area of the memory in step S107, creation of the initial matrix ($M_{ini}$) is completed, and the processing thus ends. Otherwise, the process jumps to step S109.

In step S109, i is incremented by one, and the process advances to step S110. In step S110, $B_i$ ith correction rows ($R_i$) are created of the (i−1)th propagation rows ($R'_{i−1}$) created previously in step S106. Note that $B_i \geq A_i$. Here, the $B_i$ ith correction rows have at least one "1" in total in each of the $A_i$ different columns (that is, ith correction columns) included in a column set formed by excluding the $A_1$ first correction columns to the $A_{i−1}$ (i−1)th correction columns. In addition, each of the $B_i$ ith correction rows has only one "1" in the $A_i$ ith correction columns. After step S110, the process advances to step S105.

A state in which the initial matrix ($M_{ini}$) of a mask matrix is generated through the processing shown in FIG. 13 will be described with reference to FIGS. 14, 15, 16, 17, 18, 19, and 20. Note that in this description, M=10, K=3, and L=8.

First, a zero matrix having 10 rows×8 columns is created in the work area of the memory (step S101). In addition, $A_1$=3, $A_2$=3, and $A_3$=2 are set (step S102). That is, in this example, I=3.

Figures 14, 15:
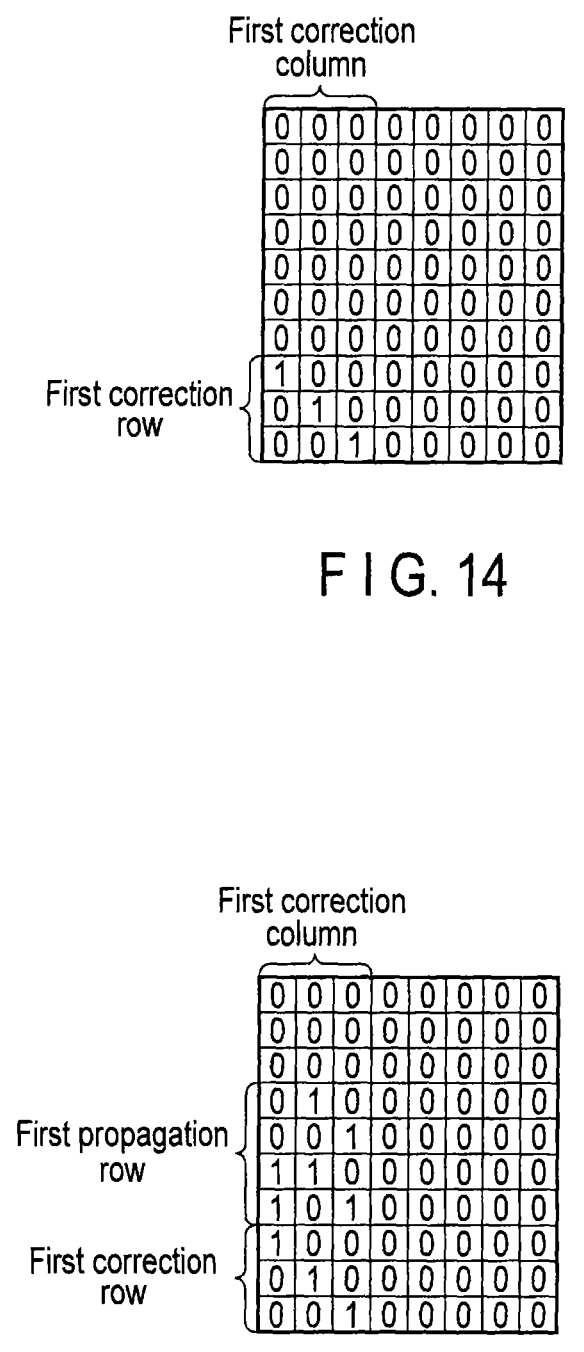

As shown in FIG. 14, 3 ($\geq A_1$) first correction rows ($R_1$) are created (step S104), and the first correction columns ($C_1$) are extracted (step S105). More specifically, the eighth, ninth, and 10th rows are created as the first correction rows such that the row weight becomes 1, and the columns where the element "1" appears do not overlap each other. In the example shown in FIG. 14, the element "1" is given to the eighth row of the first column, the ninth row of the second column, and the 10th row of the third column. That is, the first, second, and third columns are extracted as the first correction columns ($C_1$).

Next, as shown in FIG. 15, 4 ($\geq 3 = A_2$) first propagation rows ($R'_1$) are created, excluding the first correction columns (step S106). More specifically, the element "1" is assigned to the first propagation rows (that is, fourth, fifth, sixth, and seventh rows) such that the column weight of the first correction columns becomes 3. At this time, the first correction columns ($C_1$) are decided and deleted from the work area of the memory (step S107). However, the processing continues because undecided columns remain.

Figures 16, 17:
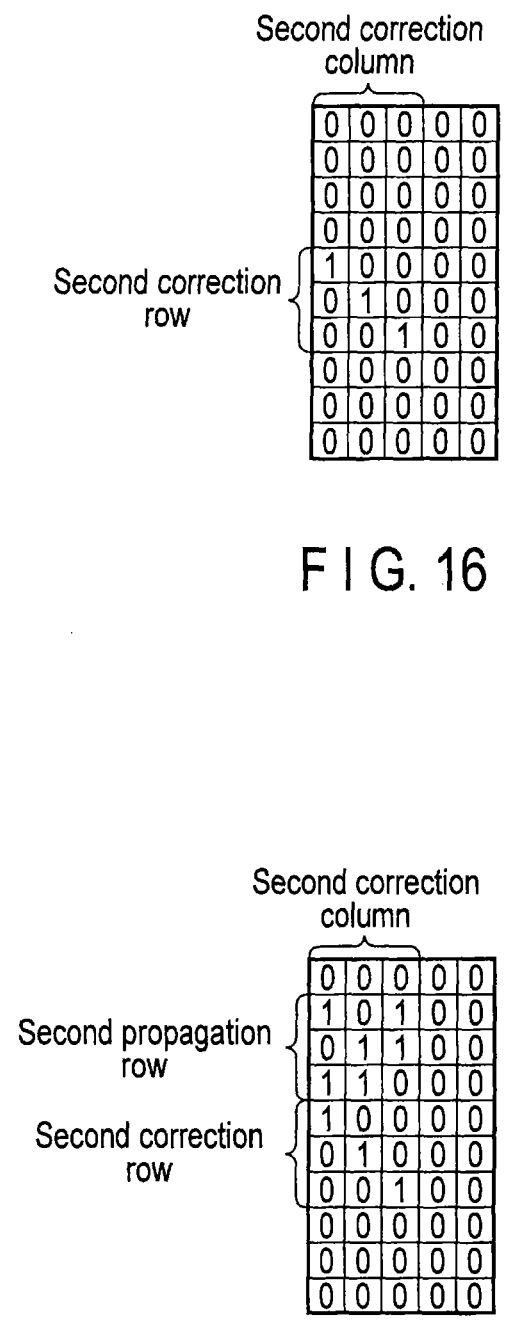

As shown in FIG. 16, 3 ($\geq A_2$) second correction rows ($R_2$) are created of the first propagation rows (step S110), and the second correction columns ($C_2$) are extracted (step S105). Then, as shown in FIG. 17, 3 ($\geq 2 = A_3$) second propagation rows ($R'_2$) are created, excluding the first correction columns and the second correction columns (step S106). At this time, the second correction columns ($C_2$) are decided and deleted from the work area of the memory (step S107). However, the processing continues because undecided columns remain.

As shown in FIG. 18, 2 ($\geq A_3$) third correction rows ($R_3$) are created of the second propagation rows (step S110), and the third correction columns ($C_3$) are extracted (step S105). Then, as shown in FIG. 19, 2 ($\geq 0 = A_4$) third propagation rows ($R'_3$) are created, excluding the first correction columns, the second correction columns, and the third correction columns (step S106). At this time, the third correction columns ($C_3$) are decided and deleted from the work area of the memory (step S107). In addition, the processing ends because no undecided column remains.

According to this example, the initial matrix ($M_{ini}$) shown in FIG. 20 is created. According to the initial matrix shown in FIG. 20, a burst error over eight columns can be corrected by 3 (=I) iterated decoding processes. On the other hand, according to the mask matrix (Z1 or Z2) of the comparative example, 4 (=L/2=8/2) iterated decoding processes are necessary to correct the burst error over eight columns, as described above. Hence, this initial matrix can reduce the number of iterated decoding processes necessary to correct the burst error over eight columns as compared to the mask matrix (Z1 or Z2) of the comparative example. Note that in this example, $A_1$=3, $A_2$=3, and $A_3$=2 are set, thereby achieving I=3. However, an arbitrary positive integer can be set to $A_i$ as long as expressions (8) and (10) are met.

Figure 21:
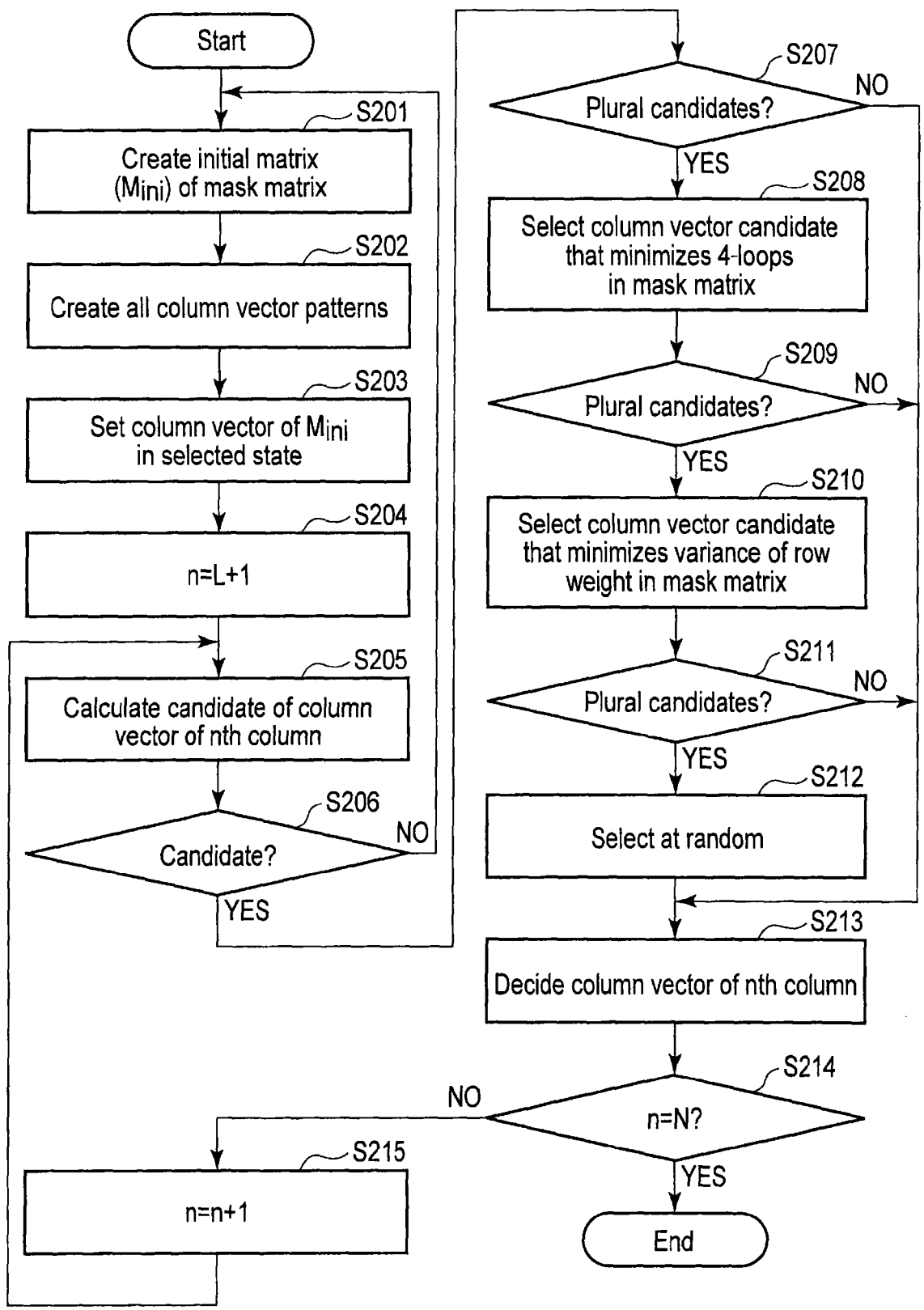
FIG. 21 is a flowchart showing processing of creating a mask matrix.

As described above, the mask matrix is created by, for example, extending the number of columns of the initial matrix ($M_{ini}$) created in accordance with the flowchart of FIG. 13 from L to N. FIG. 21 shows creation processing of a mask matrix. The processing shown in FIG. 21 is executed by a processor connected to a memory. Typically, a computer executes the processing shown in FIG. 21. The processing shown in FIG. 21 starts from step S201.

In step S201, the initial matrix ($M_{ini}$) of a mask matrix is created. That is, for example, processing shown in FIG. 13 is executed in step S201. In addition, all column vector patterns are created (step S202). More specifically, all patterns of column vectors having K elements "1" and (M−K) elements "0" are created. The total number of such column vector patterns is ${}_M C_K$. When, for example, M=10 and K=3, 120 patterns can be created.

Of the column vectors created in step S202, those included in the initial matrix ($M_{ini}$) created in step S201 are handled as selected. If, for example, L=8, eight column vectors included in the initial matrix are handled as selected. The selected column vectors cannot be included in candidates from step S205 to be described later. By this handling, only (K−1) rows where the element "1" appears overlap at maximum between two arbitrary column vectors in the mask matrix, as shown in FIG. 12. That is, even when errors occur in two arbitrary columns of the mask matrix, they can be corrected. For this reason, the LDPC code corresponding to the mask matrix created by the processing shown in FIG. 21 has an improved resistance to a plurality of burst errors as compared to the LDPC code corresponding to each mask matrix according to the comparative example.

In step S204, n=L+1 is set, where n is a variable that specifies a column to be processed. When steps S203 and S204 are completed, the process advances to step S205.

In step S205, a candidate selectable as the nth column vector is selected. Assume that a certain column vector pattern is employed as the nth column vector. In this case, if a burst error that has occurred from the (n−L+1)th column to the nth column of the mask matrix can be corrected within the maximum number (=I) of iterated decoding processes, the column vector pattern is selected as one of the candidates. After step S205, the process advances to step S206.

If one or more candidates are selected in step S206, the process advances to step S207. Otherwise, since no mask matrix can be created, the process returns to step S201 to newly create the initial matrix ($M_{ini}$). If a plurality of candidates are selected in step S207, the process advances to step S208. If the candidates are narrowed down to one, the process advances to step S213.

In step S208, a candidate that minimizes the number of occurrences of 4-loops in the mask matrix when the candidate is employed as the nth column vector of the mask matrix is further selected. If a plurality of candidates are still selected in step S208, the process advances to step S210. If the candidates are narrowed down to one, the process advances to step S213 (step S209).

In step S210, a candidate that minimizes the variance of the row weight in the mask matrix when the candidate is employed as the nth column vector of the mask matrix is further selected. If a plurality of candidates are still selected in step S210, the process advances to step S212. If the candidates are narrowed down to one, the process advances to step S213 (step S211).

In step S212, an arbitrary candidate is selected, for example, at random from the plurality of candidates, and the process advances to step S213. Note that step S212 can be implemented by an arbitrary technique for selecting one of a plurality of candidates.

In step S213, since the candidates are narrowed down to one, the candidate is decided as the column vector of the nth column of the mask matrix. If n=N at the end of step S213, the mask matrix creation is completed, and the processing therefore ends. Otherwise, the process advances to step S215 (step S214). In step S215, n is incremented by one, and the process returns to step S205.

An LDPC code corresponding to the mask matrix created by the processing shown in FIG. 21 can correct a first burst error and a second burst error which have occurred in two arbitrary columns in the mask matrix while almost maintaining performance such as the correction capability for one burst error, the calculation amount in decoding processing, and the memory utilization, as compared to the LDPC code corresponding to each mask matrix according to the comparative example.

In step S201 of FIG. 21, the number of iterated decoding processes necessary to correct a burst error over L columns can be adjusted. For this reason, the LDPC code corresponding to the mask matrix created by the processing show in FIG. 21 can reduce the number of iterated decoding processes necessary to correct the burst error over L columns as compared to the LDPC code corresponding to each mask matrix of the comparative example.

In step S208 of FIG. 21, when a plurality of candidates exist, a candidate that minimizes the number of occurrences of 4-loops is selected. For this reason, the mask matrix created by the processing shown in FIG. 21 can reduce the number of occurrences of 4-loops as compared to each mask matrix of the comparative example. Even if the occurrence of 4-loops is unavoidable in the mask matrix, occurrence of 4-loops can be suppressed on a bit basis by adjusting the shift amounts of cyclic permutation matrices in a parity check matrix corresponding to four elements associated with each 4-loop. More specifically, adjustment is done such that all the shift amounts of cyclic permutation matrices corresponding to four elements associated with each 4-loop do not have the same value. That is, shift amounts given to at least two of four elements are made different from each other.

When cyclic permutation matrices (shift amounts are adjustable) or zero matrices are arranged in accordance with the elements of the mask matrix created by the processing shown in FIG. 21, a parity check matrix can be created. Six parity check matrices (H2, H3, H4 H5, H6, and H7) created by the parity check matrix creation method according to this embodiment will be described below. All six parity check matrices define LDPC codes each having a code length of 3136 bits and a coding rate of 43/49.

FIGS. 22A, 22B, and 22C show the parity check matrix (H2), and FIGS. 23A, 23B, and 23C show the parity check matrix (H3). The parity check matrices (H2 and H3) are created based on a mask matrix of K=3, M=12, and N=98. The size of a block matrix included in the parity check matrices (H2 and H3) is 32 bits. The parity check matrix (H2) is designed to be able to correct a burst error over 10 (=M−K+1) columns of the mask matrix by five iterated decoding processes. The parity check matrix (H3) is designed to be able to correct the burst error by four iterated decoding processes. That is, the parity check matrix (H2) needs as many iterated decoding processes as those of a parity check matrix corresponding to each mask matrix of the comparative example to correct the burst error over 10 columns of the mask matrix. On the other hand, the parity check matrix (H3) can correct the burst error over 10 columns of the mask matrix by iterated decoding processes less than those of the parity check matrix corresponding to each mask matrix of the comparative example.

Note that FIG. 22A and subsequent drawings illustrate row indices where 3 (=K) cyclic permutation matrices are arranged, respectively, in a column corresponding to each column index of the parity check matrix and shift amounts thereof (more specifically, rightward cyclic shift amounts). For example, according to FIG. 22A, in the first to 32nd columns of the parity check matrix (H2), a cyclic permutation matrix having a shift amount=0 is arranged in the first to 32nd rows, six zero matrices are arranged in the 33rd to 224th rows, a cyclic permutation matrix having a shift amount=17 is arranged in the 225th to 256th rows, one zero matrix is arranged in the 257th to 288th rows, a cyclic permutation matrix having a shift amount=10 is arranged in the 289th to 320th rows, and two zero matrices are arranged in the 321st to 384th rows.

FIGS. 24A, 24B, 24C, 24D, 24E, and 24F show the parity check matrix (H4), and FIGS. 25A, 25B, 25C, 25D, 25E, and 25F show the parity check matrix (H5). The parity check matrices (H4 and H5) are created based on a mask matrix of K=3, M=24, and N=196. The size of a block matrix included in the parity check matrices (H4 and H5) is 16 bits. The parity check matrix (H4) is designed to be able to correct a burst error over 22 (=M−K+1) columns of the mask matrix by 11 iterated decoding processes. The parity check matrix (H5) is designed to be able to correct the burst error by eight iterated decoding processes. That is, the parity check matrix (H4) needs as many iterated decoding processes as those of a parity check matrix corresponding to each mask matrix of the comparative example to correct the burst error over 22 columns of the mask matrix. On the other hand, the parity check matrix (H5) can correct the burst error over 22 columns of the mask matrix by less iterated decoding processes than those of the parity check matrix corresponding to each mask matrix of the comparative example.

FIGS. 26A, 26B, 26C, 26D, 26E, 26F, 26G, 26H, 26I, 26J, and 26K show the parity check matrix (H6), and FIGS. 27A, 27B, 27C, 27D, 27E, 27F, 27G, 27H, 27I, 27J, and 27K show the parity check matrix (H7). The parity check matrices (H6 and H7) are created based on a mask matrix of K=3, M=48, and N=392. The size of a block matrix included in the parity check matrices (H6 nd H7) is 8 bits. The parity check matrix (H6) is designed to be able to correct a burst error over 46 (=M−K+1) columns of the mask matrix by 23 iterated decoding processes. The parity check matrix (H7) is designed to be able to correct the burst error by 16 iterated decoding processes. That is, the parity check matrix (H6) needs as many iterated decoding processes as those of a parity check matrix corresponding to each mask matrix of the comparative example to correct the burst error over 46 columns of the mask matrix. On the other hand, the parity check matrix (H7) can correct the burst error over 46 columns of the mask matrix by less iterated decoding processes than those of the parity check matrix corresponding to each mask matrix of the comparative example.

FIG. 28 shows the calculation result of the resistances of the parity check matrices (H2, H3 H4, H5, H6, and H7) when one burst error has occurred. According to FIG. 28, the minimum guaranteed performance is attained by any of the parity check matrices. Note that the minimum guaranteed performance is calculated by $P \times (M-K)+1$. In addition, according to FIG. 28, the larger the row size of the mask matrix is, the more the burst error correction length is improved. According to FIG. 28, the parity check matrices (H3, H5, and H7) can reduce the maximum value of the number of iterated decoding processes necessary to correct a burst error as compared to the parity check matrices (H2, H4, and H6), respectively.

FIG. 29 shows the calculation result of the number of occurrences of 4-loops in the mask matrices corresponding to the parity check matrices (H2, H3, H4, H5, H6, and H7) and the calculation result of the number of occurrences of 4-loops in the mask matrix according to the comparative example (more specifically, Z2 of expression (3)). According to FIG. 29, the mask matrices corresponding to the parity check matrices (H2, H3 H4, H5, H6, and H7) can reduce the number of occurrences of 4-loops as compared to the mask matrix of the comparative example in all sizes. The larger the size of the mask matrix of the comparative example is, the larger the number of occurrences of 4-loops is. On the other hand, the larger the size the mask matrices corresponding to the parity check matrices (H2, H3 H4, H5, H6, and H7) is, the smaller the number of occurrences of 4-loops is.

As described above, the parity check matrix creation method according to the first embodiment creates a mask matrix having M rows×N columns such that one burst error over L arbitrary continuous columns of the mask matrix can iteratively be decoded within the maximum number of iterated decoding processes. Hence, according to this check matrix creation method, the parity check matrix can correct one burst error over L arbitrary continuous columns of the mask matrix within the maximum number of iterated decoding processes. Additionally, since the maximum number of iterated decoding processes can be set, the number of iterated decoding processes necessary to correct the burst error can be reduced by design. Furthermore, this check matrix creation method creates the mask matrix such that all of the N column vectors included in the mask matrix are different. Hence, according to this check matrix creation method, the parity check matrix can correct two burst errors that occur in two arbitrary columns of the mask matrix.

(Second Embodiment)

A parity check matrix created by the parity check matrix creation method according to the first embodiment is used for error correction decoding processing by a decoding apparatus. In addition, this parity check matrix is used for error correction encoding processing by an encoding apparatus in a state in which the parity check matrix is converted into, for example, a generator matrix. The encoding apparatus and the decoding apparatus are incorporated in, for example, a recording/reproduction system or a communication system.

A recording/reproduction apparatus according to the second embodiment includes an encoding apparatus and a decoding apparatus for error correction. The encoding apparatus and the decoding apparatus use a parity check matrix created by the parity check matrix creation method according to the first embodiment. Note that this parity check matrix can be used by all systems to which an error correcting code is applied; for example, a semiconductor memory device, a communication apparatus, or a magnetic recording/reproduction apparatus, although a detailed description thereof will be omitted.

As shown in FIG. 34, the recording/reproduction apparatus according to this embodiment includes an encoding processing unit 300, a reproduction processing unit 400, and a controller 500. The recording/reproduction apparatus creates recording data 14 from user data and writes it in an optical recording medium 600, or processes reproduced data 20 obtained from the optical recording medium 600 and reconstructs the user data. The controller 500 controls the functional units of the encoding processing unit 300 and the reproduction processing unit 400 to be described later. The encoding processing unit 300 creates the recording data 14 in accordance with an instruction from the controller 500. The reproduction processing unit 400 processes the reproduced data 20 in accordance with an instruction from the controller 500.

As shown in FIG. 30, the encoding processing unit 300 includes a scramble processing unit 301, an EDC (Error Detection Code) encoding unit 302, a BCH encoding unit 303, an LDPC encoding unit 304, a first interleaving unit 305, an RS (Reed-Solomon) encoding unit 311, a second interleaving unit 312, a data composition/SYNC data adding unit 321, a 17PP (Parity Preserve/Prohibit) modulation unit 322, and an NRZI (Non Return to Zero Inversion) conversion unit 323.

The encoding processing unit 300 receives user data 10 and a data address 11 from the controller 500. The encoding processing unit 300 creates user code data 12 by encoding the user data 10, creates BIS (Burst Indicator SubCode) data 13 by encoding the data address 11, and creates the recording data 14 based on the user code data 12 and the BIS data 13. Note that the BIS data 13 is used to detect a burst error, as will be described later.

The scramble processing unit 301 receives the user data 10 and the data address 11 from the controller 500. The scramble processing unit 301 performs scramble processing for the user data 10 based on the data address 11, thereby obtaining scrambled user data. The scramble processing unit 301 outputs the scrambled data to the EDC encoding unit 302.

The EDC encoding unit 302 receives the scrambled data from the scramble processing unit 301. The EDC encoding unit 302 performs EDC encoding for the scrambled data, thereby obtaining EDC encoded data. The EDC encoding unit 302 outputs the EDC encoded data to the BCH encoding unit 303.

The BCH encoding unit 303 receives the EDC encoded data from the EDC encoding unit 302. The BCH encoding unit 303 performs BCH encoding for the EDC encoded data, thereby obtaining BCH encoded data. The BCH encoding unit 303 outputs the BCH encoded data to the LDPC encoding unit 304.

The LDPC encoding unit 304 uses a parity check matrix created by the parity check matrix creation method according to the first embodiment in a state in which the parity check matrix is converted into, for example, a generator matrix. The LDPC encoding unit 304 receives the BCH encoded data from the BCH encoding unit 303. The LDPC encoding unit 304 performs LDPC encoding based on the parity check matrix for the BCH encoded data, thereby obtaining LDPC encoded data. The LDPC encoding unit 304 outputs the LDPC encoded data to the first interleaving unit 305.

The first interleaving unit 305 receives the LDPC encoded data from the LDPC encoding unit 304. The first interleaving unit 305 performs interleaving for the LDPC encoded data, thereby obtaining the user code data 12. The first interleaving unit 305 outputs the user code data 12 to the data composition/SYNC data adding unit 321.

The RS encoding unit 311 receives the data address 11 from the controller 500. The RS encoding unit 311 performs RS encoding for the data address 11, thereby obtaining RS encoded data. The RS encoding unit 311 outputs the RS encoded data to the second interleaving unit 312.

The second interleaving unit 312 receives the RS encoded data from the RS encoding unit 311. The second interleaving unit 312 performs interleaving for the RS encoded data, thereby obtaining the BIS data 13. The second interleaving unit 312 outputs the BIS data 13 to the data composition/SYNC data adding unit 321.

The data composition/SYNC data adding unit 321 receives the user code data 12 from the first interleaving unit 305 and the BIS data 13 from the second interleaving unit 312. The data composition/SYNC data adding unit 321 composes the user code data 12 and the BIS data 13 and adds SYNC data, thereby generating composed data. The SYNC data is used to detect the start of corresponding composed data. The data composition/SYNC data adding unit 321 outputs the composed data to the 17PP modulation unit 322.

More specifically, the data composition/SYNC data adding unit 321 generates composed data in accordance with a format shown in FIG. 31. According to FIG. 31, SYNC data is arranged at the start of composed data of one unit. The composed data of one unit corresponds to one recording frame. Next to the SYNC data, the user code data 12 having a fixed length and the BIS data 13 corresponding to one symbol of the RS code are alternately arranged. In other words, four fields having a fixed size are prepared for the user code data 12 in the composed data of one unit. BIS data corresponding to one symbol of the RS code is inserted between adjacent fields.

The 17PP modulation unit 322 receives the composed data from the data composition/SYNC data adding unit 321. The 17PP modulation unit 322 performs RLL (Run Length Limited) encoding for the composed data using a 17PP modulation code that is the modulation code of the Blu-ray scheme known as an optical disk standard, thereby obtaining RLL encoded data. The 17PP modulation unit 322 outputs the RLL encoded data to the NRZI conversion unit 323.

The NRZI conversion unit 323 receives the RLL encoded data from the 17PP modulation unit 322. The NRZI conversion unit 323 performs NRZI conversion for the RLL encoded data, thereby obtaining the recording data 14.

As shown in FIG. 32, the reproduction processing unit 400 includes a filter/PLL/equalization processing unit 401, a SYNC detection unit 402, a PRML/NRZ conversion/17PP demodulation unit 403, a data separation unit 404, a second deinterleaving unit 411, an RS decoding unit 412, a second deinterleaving unit 413, a data comparison unit 414, a burst occurrence area estimation unit 415, a burst signal correction unit 421, a first deinterleaving unit 422, an LDPC decoding unit 423, a BCH decoding unit 424, an EDC decoding unit 425, and a descramble processing unit 426.

The reproduction processing unit 400 receives the reproduced data 20 from the optical recording medium 600 and performs various processes to be described later for the reproduced data 20, thereby restoring user data 28.

The filter/PLL/equalization processing unit 401 receives the reproduced data 20 from the optical recording medium 600. The filter/PLL/equalization processing unit 401 performs signal processing including filter processing, PLL (Phase Locked Loop) processing and equalization processing, thereby obtaining equalized data. The filter/PLL/equalization processing unit 401 outputs the equalized data to the SYNC detection unit 402.

The SYNC detection unit 402 detects SYNC data from the equalized data in accordance with, for example, the format shown in FIG. 31. The SYNC detection unit 402 performs synchronization processing of the recording frame based on the detected SYNC data. The SYNC detection unit 402 outputs the synchronized data to the PRML/NRZ conversion/17PP demodulation unit 403.

The PRML/NRZ conversion/17PP demodulation unit 403 receives the synchronized data from the SYNC detection unit 402. The PRML/NRZ conversion/17PP demodulation unit 403 performs PRML processing, NRZ conversion, and 17PP demodulation for the synchronized data, thereby obtaining encoded data 21. The encoded data 21 corresponds to the logarithmic probability ratio of user code data and the logarithmic probability ratio of BIS data. The PRML/NRZ conversion/17PP demodulation unit 403 outputs the encoded data 21 to the data separation unit 404.

The data separation unit 404 receives the encoded data 21 from the PRML/NRZ conversion/17PP demodulation unit 403. The data separation unit 404 separates the encoded data 21, thereby obtaining BIS data 22 and user code data 27. The BIS data 22 corresponds to the logarithmic probability ratio of BIS data. The user code data 27 corresponds to the logarithmic probability ratio of user code data. The data separation unit 404 outputs the BIS data 22 to the second deinterleaving units 411 and 413. The data separation unit 404 outputs the user code data 27 to the burst signal correction unit 421.

The second deinterleaving unit 411 receives the BIS data 22 from the data separation unit 404. The second deinterleaving unit 411 performs deinterleaving for the BIS data 22, thereby obtaining deinterleaved BIS data. The second deinterleaving unit 411 outputs the deinterleaved BIS data to the RS decoding unit 412.

The RS decoding unit 412 receives the deinterleaved BIS data from the second deinterleaving unit 411. The RS decoding unit 412 performs RS decoding for the deinterleaved BIS data, thereby obtaining BIS data 23. Note that the BIS data 23 corresponds to a data address 24. The RS decoding unit 412 outputs the BIS data 23 to the data comparison unit 414. The RS decoding unit 412 also outputs the data address 24 to the descramble processing unit 426.

The second deinterleaving unit 413 receives the BIS data 22 from the data separation unit 404. The second deinterleaving unit 413 performs the same deinterleaving as that of the second deinterleaving unit 411 for the BIS data 22, thereby obtaining deinterleaved BIS data. The second deinterleaving unit 413 outputs the deinterleaved BIS data to the data comparison unit 414.

The data comparison unit 414 receives the BIS data 23 from the RS decoding unit 412 and the deinterleaved BIS data from the second deinterleaving unit 413. The data comparison unit 414 compares the BIS data 23 with the deinterleaved BIS data, thereby determining an error included in the deinterleaved BIS data. As the result of determination, the data comparison unit 414 obtains BIS data error position information 25. As described above, the BIS data 23 is generated by performing RS decoding for the deinterleaved BIS data. Hence, when the two pieces of data are compared, an error included in the deinterleaved BIS data can be determined. The data comparison unit 414 outputs the BIS data error position information 25 to the burst occurrence area estimation unit 415.

The burst occurrence area estimation unit 415 receives the BIS data error position information 25 from the data comparison unit 414. The burst occurrence area estimation unit 415 estimates the occurrence area of a burst error in the user code data based on the BIS data error position information 25, thereby obtaining burst occurrence area information 26. The burst occurrence area estimation unit 415 outputs the burst occurrence area information 26 to the burst signal correction unit 421. Note that the burst occurrence area estimation unit 415 may estimate the occurrence area of a burst error in the user code data based on the information of the presence/absence of an error of SYNC data in addition to the BIS data error position.

Figure 33:
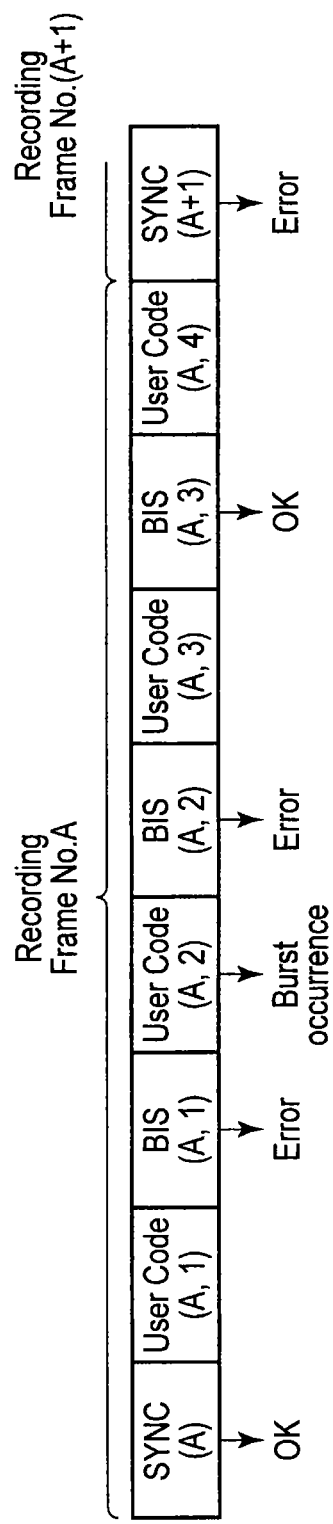
FIG. 33 is an explanatory view of a technique of estimating a burst occurrence area under the format shown in FIG. 31.

For example, assume that, as shown in FIG. 33, SYNC data (SYNC (A)) and third BIS data (BIS (A, 3)) are correct, and first and second BIS data (BIS (A, 1) and BIS (A, 2)) are wrong. When a burst error is assumed to have occurred, the possibility of the second user code data (A, 2) arranged between the first and second BIS data being wrong is high. For this reason, according to the example of FIG. 33, the burst occurrence area estimation unit 415 estimates the second user code data as a burst occurrence area.

The burst signal correction unit 421 receives the burst occurrence area information 26 from the burst occurrence area estimation unit 415 and the user code data 27 from the data separation unit 404. The burst signal correction unit 421 specifies the burst occurrence area in the user code data 27 based on the burst occurrence area information 26. The burst signal correction unit 421 corrects the logarithmic probability ratio of bits corresponding to the burst occurrence area of the user code data 27 to, for example, 0, thereby obtaining corrected user code data. Logarithmic probability ratio=0 means that the probability that a corresponding bit is 0 and the probability that the bit is 1 equal. According to this correction, it is possible to prevent a wrong logarithmic probability ratio in the burst occurrence area from having an adverse effect outside the burst occurrence area in LDPC decoding to be performed by the LDPC decoding unit 423. The burst signal correction unit 421 outputs the corrected user code data to the first deinterleaving unit 422.

The first deinterleaving unit 422 receives the corrected user code data from the burst signal correction unit 421. The first deinterleaving unit 422 performs deinterleaving for the corrected user code data, thereby obtaining deinterleaved user code data. The first deinterleaving unit 422 outputs the deinterleaved user code data to the LDPC decoding unit 423.

The LDPC decoding unit 423 uses a parity check matrix created by the parity check matrix creation method according to the first embodiment. The LDPC decoding unit 423 receives the deinterleaved user code data from the first deinterleaving unit 422. The LDPC decoding unit 423 performs LDPC decoding based on the parity check matrix for the deinterleaved user code data, thereby obtaining LDPC decoded data. The LDPC decoding unit 423 outputs the LDPC decoded data to the BCH decoding unit 424.

The BCH decoding unit 424 receives the LDPC decoded data from the LDPC decoding unit 423. The BCH decoding unit 424 performs BCH decoding for the LDPC decoded data, thereby obtaining BCH decoded data. The BCH decoding unit 424 outputs the BCH decoded data to the EDC decoding unit 425.

The EDC decoding unit 425 receives the BCH decoded data from the BCH decoding unit 424. The EDC decoding unit 425 performs EDC decoding for the BCH decoded data, thereby obtaining EDC decoded data. The EDC decoding unit 425 outputs the EDC decoded data to the descramble processing unit 426.

The descramble processing unit 426 receives the data address 24 from the RS decoding unit 412 and the EDC decoded data from the EDC decoding unit 425. The descramble processing unit 426 performs descramble processing for the EDC decoded data based on the data address 24, thereby obtaining the user data 28. The descramble processing unit 426 outputs the user data 28 to the controller 500.

As described above, the recording/reproduction apparatus according to the second embodiment performs LDPC encoding and LDPC decoding based on a parity check matrix created by the parity check matrix creation method according to the first embodiment. Hence, according to this recording/reproduction apparatus, it is possible to stably reproduce data even when a burst error has occurred.

The processing in the above-described embodiments can be implemented using a general-purpose computer as basic hardware. A program implementing the processing in each of the above-described embodiments may be stored in a computer readable storage medium for provision. The program is stored in the storage medium as a file in an installable or executable format. The storage medium is a magnetic disk, an optical disc (CD-ROM, CD-R, DVD, or the like), a magnetooptic disc (MO or the like), a semiconductor memory, or the like. That is, the storage medium may be in any format provided that a program can be stored in the storage medium and that a computer can read the program from the storage medium. Furthermore, the program implementing the processing in each of the above-described embodiments may be stored on a computer (server) connected to a network such as the Internet so as to be downloaded into a computer (client) via the network.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A parity check matrix creation method comprising:

creating a mask matrix whose column weight is K (K is an integer not less than 2) by assigning one of "1" and "0" to each element of M rows×N columns (M is an integer not less than 4, and N is an integer larger than M); and creating a parity check matrix by, for each element in the mask matrix, arranging a cyclic permutation matrix having P rows×P columns (P is an integer not less than 2) at a corresponding position when the element is "1" and arranging a zero matrix having P rows×P columns at a corresponding position when the element is "0", wherein all N column vectors in the mask matrix are different, any submatrix having M rows×L columns (L is an integer not more than (M−K+1)) obtained by arbitrarily extracting L continuous columns from the mask matrix includes:

$B_1$ ($B_1$ is an integer not less than 1) first correction rows; and $B_i$, ($B_i$, is an integer not less than 1, i includes all integers not less than 2 and not more than I, and I is an integer not less than 2) ith correction rows, each of the $B_1$ first correction rows has a row weight of 1, the $B_1$ first correction rows have at least one "1" in total in each of $A_1$ ($A_1$ is an integer not less than 1 and not more than $B_1$) first correction columns, each of the $B_i$ ith correction rows has a row weight of not less than 2, each of the $B_i$ ith correction rows has at least one "1" in total in $A_{i-1}$ ($A_{i-1}$ is an integer not less than 1 and not more than $B_{i-1}$) (i−1)th correction columns, each of the $B_i$ ith correction rows has "1" in one of $A_i$ ($A_i$ is an integer not less than 1 and not more than $B_i$) ith correction columns included in a column set excluding the first correction columns to (i−1)th correction columns, the $B_i$ ith correction rows include at least one "1" in total in each of the $A_i$ ith correction columns, a sum from $A_1$ to $A_I$ equals L, and $B_i$ is not more than $A_{i-1} \times (K-1)$.

2. The method according to claim 1, wherein $A_I$ equals 1, $B_I$ equals K, $B_{i-1}$ equals $A_{i-1}$, and L equals M−K+1.

3. The method according to claim 1, wherein $A_I$ is not less than 2, the submatrix includes at least one Ith propagation row, each of the at least one propagation row has at least two "1"s in total in the $A_1$ Ith correction columns.

4. The method according to claim 1, wherein $A_I$ is not less than 2, $B_I$ equals $A_I$, $B_{i-1}$ equals $A_{i-1}$, and L equals M−K+1, the submatrix includes (K−1) Ith propagation rows, and each of the (K−1) Ith propagation rows has "1" in all the $A_I$ Ith correction columns.

5. The method according to claim 1, further comprising setting the value $A_1$ and the value $A_i$.

6. The method according to claim 1, further comprising setting the value $A_1$ and the value $A_i$ such that I becomes not more than L/2.

7. The method according to claim 1, further comprising setting a cyclic shift amount of each row included in a cyclic permutation matrix arranged at at least one of four positions corresponding to four elements where 4-loops occur in the mask matrix to a first value and setting the shift amount of a cyclic permutation matrix arranged at at least one of the remaining positions to a second value different from the first value.

8. An encoding apparatus comprising an encoding unit configured to encode data based on a parity check matrix created by the method of claim 1.

9. A recording/reproduction apparatus comprising:

a first encoding unit configured to encode first data based on a parity check matrix created by the method of claim 1 and obtain first encoded data;

a second encoding unit configured to encode second data different from the first data and obtain second encoded data;

a composition unit configured to compose the first encoded data and the second encoded data and create a data frame to be recorded in a recording medium;

a first decoding unit configured to decode the second encoded data of reproduced data of the data frame from the recording medium and obtain second decoded data;

an estimation unit configured to estimate an occurrence area of a burst error in the first encoded data of the reproduced data based on the second decoded data;

a correction unit configured to correct a value for each bit corresponding to the occurrence area of the first encoded data to a value representing that a probability that the bit is 0 and a probability that the bit is 1 equal in order to obtain corrected first encoded data; and a second decoding unit configured to decode the corrected first encoded data based on the parity check matrix to obtain first decoded data.

10. The apparatus according to claim 9, wherein the correction unit corrects the value for each bit corresponding to the occurrence area of the first encoded data to "0" and obtains the corrected first encoded data.

* * * * *